United States Patent
Chen et al.

(10) Patent No.: US 10,426,035 B2
(45) Date of Patent: Sep. 24, 2019

(54) SGS OR GSGSG PATTERN FOR SIGNAL TRANSMITTING CHANNEL, AND PCB ASSEMBLY, CHIP PACKAGE USING SUCH SGS OR GSGSG PATTERN

(71) Applicant: MEDIATEK INC., Hsin-Chu (TW)

(72) Inventors: Nan-Jang Chen, Hsinchu (TW); Yau-Wai Wong, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 21 days.

(21) Appl. No.: 15/921,676

(22) Filed: Mar. 15, 2018

(65) Prior Publication Data

US 2018/0206339 A1 Jul. 19, 2018

Related U.S. Application Data

(60) Continuation-in-part of application No. 14/992,011, filed on Jan. 10, 2016, now Pat. No. 9,955,581, which
(Continued)

(51) Int. Cl.
*H05K 1/18* (2006.01)
*H01L 23/495* (2006.01)
(Continued)

(52) U.S. Cl.
CPC ......... *H05K 1/18* (2013.01); *H01L 23/3185* (2013.01); *H01L 23/49503* (2013.01); *H01L 23/49524* (2013.01); *H01L 23/49531* (2013.01); *H01L 23/49541* (2013.01); *H01L 23/49548* (2013.01); *H01L 23/49551* (2013.01); *H01L 23/49558* (2013.01); *H01L 23/49838* (2013.01); *H01L 24/49* (2013.01); *H02H 9/046* (2013.01); *H05K 1/0216* (2013.01); *H05K 1/0245* (2013.01); *H01L 24/48* (2013.01); *H01L 2223/6611* (2013.01); *H01L 2224/32245* (2013.01); *H01L 2224/48095* (2013.01); *H01L 2224/48247* (2013.01); *H01L 2224/48257* (2013.01); *H01L 2224/49109* (2013.01);
(Continued)

(58) Field of Classification Search
USPC .......................................... 361/56, 212, 220
See application file for complete search history.

(56) References Cited

U.S. PATENT DOCUMENTS 5,559,306 A 9/1996 Mahulikar
7,145,411 B1 12/2006 Blair
(Continued)

FOREIGN PATENT DOCUMENTS

CN 101740536 A 6/2010
CN 101887876 A 11/2010

*Primary Examiner* — Danny Nguyen
(74) *Attorney, Agent, or Firm* — Winston Hsu

(57) ABSTRACT

A substrate having multiple metal layers is disclosed. The substrate includes a plurality of metal layers disposed in different levels. The plurality of metal layers includes a lower metal layer, a middle metal layer situated overlying the lower layer, and an upper metal layer situated overlying the middle metal layer. A solder mask covers the upper metal layer. A reference plane is arranged in the lower metal layer. A trio of signal traces is arranged in the middle metal layer. The trio of signal traces comprises at least a pair of differential signal traces. A plurality of reference nets is arranged in the middle metal layer.

35 Claims, 25 Drawing Sheets

US 10,426,035 B2
Page 2

Related U.S. Application Data is a division of application No. 13/892,323, filed on May 13, 2013, now Pat. No. 9,269,653.

(60) Provisional application No. 61/665,267, filed on Jun. 27, 2012, provisional application No. 61/669,898, filed on Jul. 10, 2012, provisional application No. 61/675,605, filed on Jul. 25, 2012.

(51) Int. Cl.
*H05K 1/02* (2006.01)
*H01L 23/31* (2006.01)
*H02H 9/04* (2006.01)
*H01L 23/498* (2006.01)
*H01L 23/00* (2006.01)

(52) U.S. Cl.
CPC ............... *H01L 2224/49171* (2013.01); *H01L 2224/73265* (2013.01); *H01L 2924/00* (2013.01); *H01L 2924/00012* (2013.01); *H01L 2924/00014* (2013.01); *H01L 2924/181* (2013.01); *H01L 2924/19107* (2013.01); *H01L 2924/3011* (2013.01); *H01L 2924/30105* (2013.01); *H01L 2924/30107* (2013.01); *H01L 2924/30111* (2013.01)

(56) References Cited

U.S. PATENT DOCUMENTS

| 8,058,720 | B2 | 11/2011 | Chen | |
|---|---|---|---|---|
| 2003/0102550 | A1 | 6/2003 | Mihara | |
| 2005/0170790 | A1* | 8/2005 | Chang | H04B 1/005 455/90.3 |
| 2007/0120192 | A1 | 5/2007 | Dunnihoo | |
| 2008/0088007 | A1 | 4/2008 | Quach | |
| 2008/0266019 | A1* | 10/2008 | Fusayasu | H04B 3/34 333/12 |
| 2010/0123226 | A1 | 5/2010 | Chen | |
| 2010/0290202 | A1 | 11/2010 | Sasaki | |
| 2011/0279935 | A1 | 11/2011 | Iwasa | |
| 2012/0012357 | A1 | 1/2012 | Horan | |
| 2012/0020416 | A1 | 1/2012 | Shimura | |
| 2012/0025210 | A1 | 2/2012 | Saeki | |
| 2012/0218729 | A1 | 8/2012 | Carey | |

* cited by examiner

SGS OR GSGSG PATTERN FOR SIGNAL TRANSMITTING CHANNEL, AND PCB ASSEMBLY, CHIP PACKAGE USING SUCH SGS OR GSGSG PATTERN

CROSS REFERENCE TO RELATED APPLICATION

This application is a continuation-in-part of U.S. application Ser. No. 14/992,011 filed Jan. 10, 2016. U.S. application Ser. No. 14/992,011 is a division of U.S. application Ser. No. 13/892,323 filed May 13, 2013, which itself claims the benefits from U.S. provisional application No. 61/665,267 filed 2012 Jun. 27, U.S. provisional application No. 61/669,898 filed 2012 Jul. 10, and U.S. provisional application No. 61/675,605 filed 2012 Jul. 25.

BACKGROUND

The present invention relates to improved signal transmitting channel with SGS or GSGSG pattern for high-speed signaling applications. This channel design can be implemented in, for example, printed circuit boards (PCBs), PCB assembly (PCBA), chip packages such as leadframe packages or the like, for both differential-mode impedance ($Z_{diff}$) and common-mode impedance ($Z_{com}$) matching.

As known in the art, semiconductor integrated circuit (IC) chips have input/output (I/O) pads that are connected to external circuitry in order to function as part of an electronic system. The connection media may be an array of metallic leads such as a leadframe or a support circuit such as a ball grid array (BGA) substrate. Wire bonding and flip-chip bonding are two widely used connection techniques. In wire bonding approach, wires are bonded, one at a time, from the chip to external circuitry by ultrasonic or thermocompression processes. During wire bonding, mechanical force such as pressure or a burst of ultrasonic vibration and elevated temperature are typically required to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows, it is cooled down and solidified to form solder joints between the pads and the bond sites. A major advantage of flip-chip bonding over wiring bonding is that it provides shorter connection paths between the chip and the external circuitry, and therefore has better electrical characteristics such as less inductive noise, crosstalk, propagation delay and waveform distortion.

A leadframe typically includes a plurality of metal leads temporarily held together in a planar arrangement about a central region during package manufacture by a rectangular frame. A die pad is supported in the central region by a plurality of tie bars that attach to the frame. The leads extend from a first end integral with the frame to an opposite second end adjacent to, but spaced apart from, the die pad. During package manufacture, a semiconductor die is attached to the die pad. Wire-bonding pads on the die are then connected to selected ones of the inner leads by fine, conductive bonding wires to convey power, ground or signals between the die and the leads. A protective body of an epoxy resin is molded over the assembly to enclose and seal the die, the inner leads, and the wire bonds against harmful environmental elements. The rectangular frame and the outer ends of the leads are left exposed outside of the body, and after molding, the frame is cut away from the leads and discarded, and the outer ends of the leads are appropriately formed for interconnection of the package with an external printed circuit board.

A semiconductor chip can generate or receive a high-speed I/O signal at an I/O cell and may conduct the signal to or from a package terminal. The high-speed I/O signals may travel on transmission lines that are intended to maintain signal fidelity over a distance. Signal integrity is a set of measures of the quality of an electrical signal. Signal integrity engineering is an important activity at all levels of electronics packaging and assembly, from internal connections of an IC, through the package, the printed circuit board (PCB), the backplane, and inter-system connections. In nanometer technologies at 0.13 μm and below, unintended interactions between signals (e.g. crosstalk) became an important consideration for digital design. At these technology nodes, the performance and correctness of a design cannot be assured without considering noise effects.

The main cause of signal integrity problems is crosstalk. This is primarily due to coupling capacitance, but in general it may be caused by mutual inductance, substrate coupling, non-ideal gate operation, and other sources. The fixes normally involve changing the sizes of drivers and/or spacing of wires. In digital ICs, noise in a signal of interest arises primarily from coupling effects from switching of other signals. Increasing interconnect density has led to each wire having neighbors that are physically closer together, leading to increased coupling capacitance between neighboring nets. Larger mutual capacitance and mutual inductance also induce larger common-mode impedance and smaller differential impedance. The signal reflection also causes poor signal integrity due to impedance mismatch.

As circuits have continued to shrink in accordance with Moore's law, some effects have conspired to make noise problems worse. For example, to keep resistance tolerable despite decreased width, modern wire geometries are thicker in proportion to their spacing. This increases the sidewall capacitance at the expense of capacitance to ground, hence increasing the induced noise voltage. These effects have increased the interactions between signals and decreased the noise immunity of digital circuits. This has led to noise being a significant problem for digital ICs and high-speed signaling applications.

As a consequence of the low impedance required by matching, PCB signal traces carry much more current than their on-chip counterparts. This larger current induces crosstalk primarily in a magnetic, or inductive, mode, as opposed to a capacitive mode. The signal itself and its returning signal current path are equally capable of generating inductive crosstalk. Although differential trace pairs may help to reduce these effects, however, in some cases, there are still drawbacks to be overcome. For example, in leadframe packages or circuit boards such as 2-layer PCBs, the lack of a near reference plane (e.g. power plane or ground plane) leads to larger mutual inductance and capacitance, this in turns, causes smaller differential-mode impedance ($Z_{diff}$) and larger common-mode impedance ($Z_{com}$), which are undesirable in high-speed signal transmission applications such as data transmission through interfaces that are compatible with Mobile High-Definition Link (MHL) specification.

SUMMARY

It is one objective of this invention to provide an improved semiconductor circuit structure with improved performance, better signal integrity and fidelity.

To these ends, according to one aspect of the present invention, there is provided printed circuit board (PCB) assembly including a PCB comprising a core substrate, a plurality of conductive traces on a first surface of the PCB, and a ground layer on the second surface of the PCB, wherein the conductive traces comprise a pair of differential signal traces; an intervening reference trace disposed between the differential signal traces; a connector at one end of the plurality of conductive traces; and a semiconductor package mounted on the first surface at the other end of the plurality of conductive traces.

From another aspect of this invention, a leadframe package is provided. The leadframe package includes a die pad; a semiconductor die mounted on the die pad; a plurality of leads disposed in a first horizontal plane along peripheral edges of the die pad; a reference inner lead intervening between two adjacent, successive high-speed signal leads of the leads; a ground bar downset from the first horizontal plane to a second horizontal plane; a plurality of tie bars extending outward from the four corners of the die pad; a plurality of first bonding wires for electrically connecting the semiconductor die to the leads respectively; and a molding compound encapsulating the semiconductor die, the first bonding wires, the leads, the ground bar, the tie bars, and the die pad, wherein the die pad is exposed within a bottom surface of the molding compound.

From still another aspect of this invention, a quad-flat non-leaded (QFN) package includes a die pad; a semiconductor die mounted on the die pad; a plurality of leads disposed in a horizontal plane along peripheral edges of the die pad, wherein each lead comprises an exposed lead and an embedded, half-etched inner lead adjoined to the exposed lead; an intervening reference lead between two adjacent, successive high-speed leads of the plurality of leads; a plurality of tie bars extending outward from the die pad; a plurality of first bonding wires for electrically connecting the semiconductor die to the leads respectively; and a molding compound at least encapsulating the semiconductor die, the first bonding wires, the leads, the tie bars, and the die pad, wherein the die pad is exposed within a bottom surface of the molding compound.

From yet another aspect of this invention, a leadframe package includes a die pad; a semiconductor die mounted on the die pad; a plurality of leads disposed in a horizontal plane along peripheral edges of the die pad; a plurality of tie bars extending outward from the die pad; a plurality of bonding wires for electrically connecting the semiconductor die to the leads respectively; a molding compound encapsulating the semiconductor die, the bonding wires, the leads, the tie bars, and the die pad, wherein the die pad is exposed within a bottom surface of the molding compound; and an extended metal layer on a bottom surface of the leadframe package.

From yet another aspect of this invention, a leadframe package includes a die pad; a semiconductor die mounted on the die pad; a plurality of leads disposed in a first horizontal plane along peripheral edges of the die pad; a lead-lock tape transversely attached across the plurality of leads around the die pad; a metal layer disposed on the lead-lock tape; a ground bar downset from the first horizontal plane to a second horizontal plane; a plurality of tie bars extending outward from the die pad; a plurality of first bonding wires for electrically connecting the semiconductor die to the leads respectively; and a molding compound at least encapsulating the semiconductor die, the first bonding wires, the leads, the lead-lock tape, the metal layer, the ground bar, the tie bars, and the die pad, wherein the die pad is exposed within a bottom surface of the molding compound.

According to another aspect of the invention, a substrate having multiple metal layers is disclosed. The substrate includes a plurality of metal layers disposed in different levels. The plurality of metal layers comprises a lower metal layer, a middle metal layer situated overlying the lower layer, and an upper metal layer situated overlying the middle metal layer. A solder mask covers the upper metal layer. A reference plane is arranged in the lower metal layer. A trio of signal traces is arranged in the middle metal layer. The trio of signal traces comprises at least a pair of differential signal traces. A plurality of reference nets is arranged in the middle metal layer.

According to one embodiment, the substrate includes a plurality of metal layers disposed in different levels. The plurality of metal layers comprises a lower metal layer, a middle metal layer situated overlying the lower layer, and an upper metal layer situated overlying the middle metal layer. A solder mask covers the upper metal layer. A reference plane is arranged in the lower metal layer. A trio of signal traces comprising a first signal trace arranged in the upper metal layer and a second signal trace and a third signal trace arranged in the middle metal layer is provided. The trio of signal traces comprises at least a pair of differential signal traces. A first reference net is arranged in the middle metal layer between the second signal trace and the third signal trace and directly under the first signal trace.

According to one embodiment, the substrate includes a plurality of metal layers disposed in different levels. The plurality of metal layers comprises a lower metal layer, a first middle metal layer situated overlying the lower layer, a second middle metal layer situated overlying the first middle metal layer, and an upper metal layer situated overlying the second middle metal layer. A first reference plane is arranged in the lower metal layer. A second reference plane is arranged in the upper metal layer. A trio of signal traces comprising a first signal trace arranged in the second middle metal layer, and a second signal trace and a third signal trace arranged in the first middle metal layer is provided. The trio of signal traces comprises at least a pair of differential signal traces. A pair of reference nets is arranged in the second middle metal layer. The pair of reference nets sandwich about the first signal trace.

According to one embodiment, the substrate includes a plurality of metal layers disposed in different levels. The plurality of metal layers comprises a lower metal layer, a middle metal layer situated overlying the lower layer, and an upper metal layer situated overlying the middle metal layer. A solder mask covers the upper metal layer. A reference plane is arranged in the lower metal layer. A trio of signal traces comprising a first signal trace arranged in the middle metal layer, and a second signal trace and a third signal trace arranged in the upper metal layer is provided. The trio of signal traces comprises at least a pair of differential signal traces. A first pair of reference nets is arranged in the middle metal layer. The first pair of reference nets sandwich about the first signal trace.

According to one embodiment, the substrate includes a plurality of metal layers disposed in different levels. The plurality of metal layers comprises a lower metal layer, a first middle metal layer situated overlying the lower layer, a second middle metal layer situated overlying the first middle metal layer, a third middle metal layer situated overlying the second middle metal layer, and an upper metal layer situated overlying the third middle metal layer. A first reference plane is arranged in the lower metal layer. A second reference plane is arranged in the first middle metal layer. A trio of signal traces comprising a first signal trace arranged in the second middle metal layer, a second signal trace arranged in the third middle metal layer, and a third signal trace arranged in the upper metal layer, is provided. The trio of signal traces comprises at least a pair of differential signal traces.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
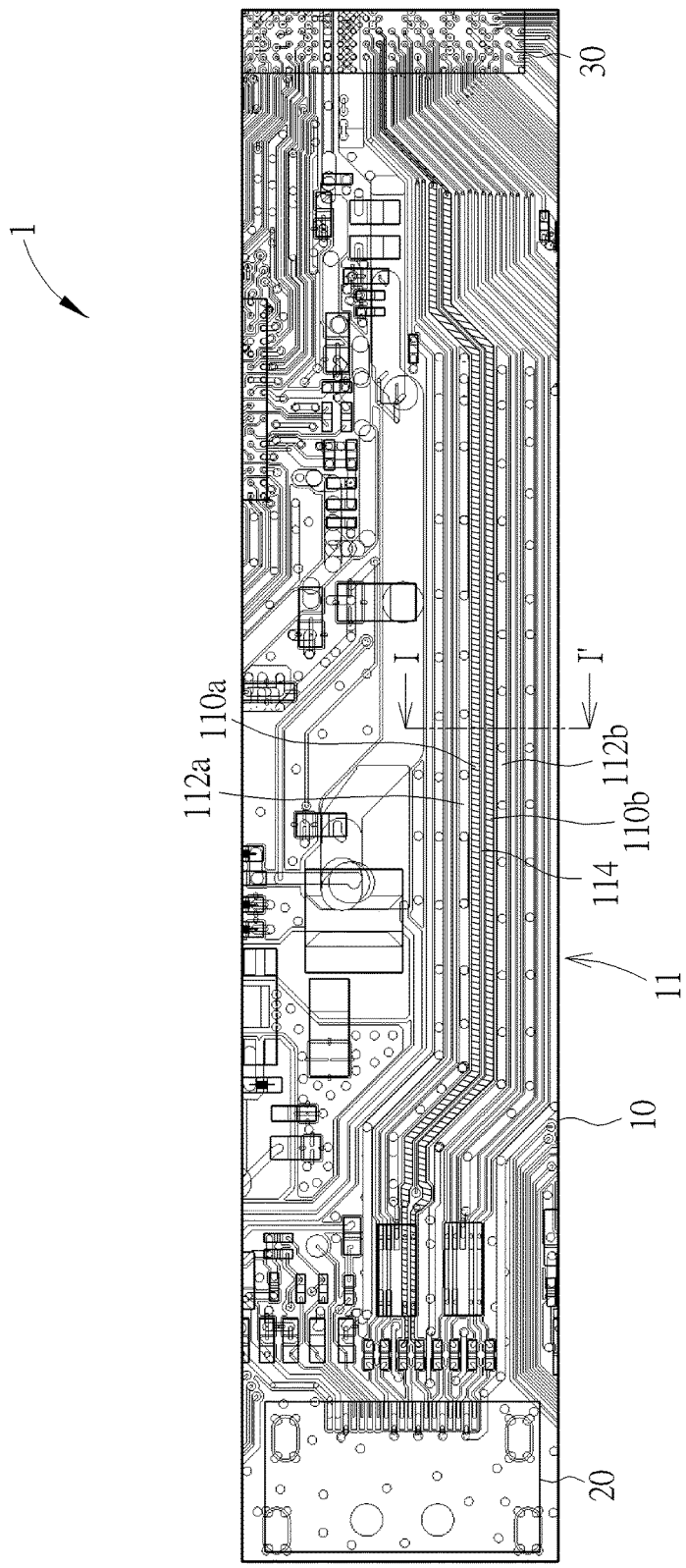
FIG. 1A is a partial plan view of an exemplary 2-layer PCB of an interface device such as an HDMI interface device.

One or more implementations of the present invention will now be described with reference to the attached drawings, wherein like reference numerals are used to refer to like elements throughout, and wherein the illustrated structures are not necessarily drawn to scale.

The present invention pertains to an improved channel for transmitting, for example, differential mode and common mode signals simultaneously, which is suited for high-speed signal transmission applications such as data transmission interfaces that are compatible with Mobile High-Definition Link (MHL) specification. The invention may be embodied in various forms, for example, in printed circuit boards (PCBs), PCB assembly (PCBA), chip packages such as leadframe packages, or any place in the signal transmission channel or connector device that involves crowded or paired high-speed or high frequency traces (in PCBs) or leads (in packages), for example, paired MHL+ and MHL− differential signal traces in PCBs.

The MHL specification is a high-definition (HD) video and digital audio interface for connecting mobile phones and portable devices to HDTVs and other home entertainment products. It utilizes established connectors and features a single cable with a 5-pin interface, supports 1080p HD video and digital audio and simultaneously provides power to the mobile device. It also enables the TV remote to control the mobile phone and access its contents.

In order to conform to the MHL specification in the high-speed signal transmission applications, a costly 4-layer PCBs and/or BGA package substrates are typically employed in the MHL enable interface devices. By utilizing the inventive SGS or GSGSG channel circuit design, both the differential-mode impedance ($Z_{diff}$) and common-mode impedance ($Z_{com}$) can conform to the MHL specification, which $Z_{diff}$ is close to 100Ω (±15Ω) and $Z_{com}$ is close to 30Ω (±6Ω), which can be realized by using a cost-effective 2-layer PCB, while the routing space on the 2-layer PCB is not sacrificed. However, it is understood that the present invention may be applicable to multi-layer PCBs.

Hereinafter, the term "2-layer PCB" refers to a PCB having only one layer of conductive traces on each side of the core substrate of the PCB, and the term "PCBA" refers to a PCB assembly including at least one electronic component such as a chip or package mounted on a component side of the PCB. The term "SGS" refers to a circuit layout structure comprising an intervening reference trace or lead sandwiched by a pair of high-speed/high-frequency signal traces or leads, which operates greater than 1 Gb/s. The term "GSGSG" refers to a circuit layout structure comprising the aforesaid SGS pattern and a pair of ground guard lines sandwiching about the SGS pattern.

Figure 1B:
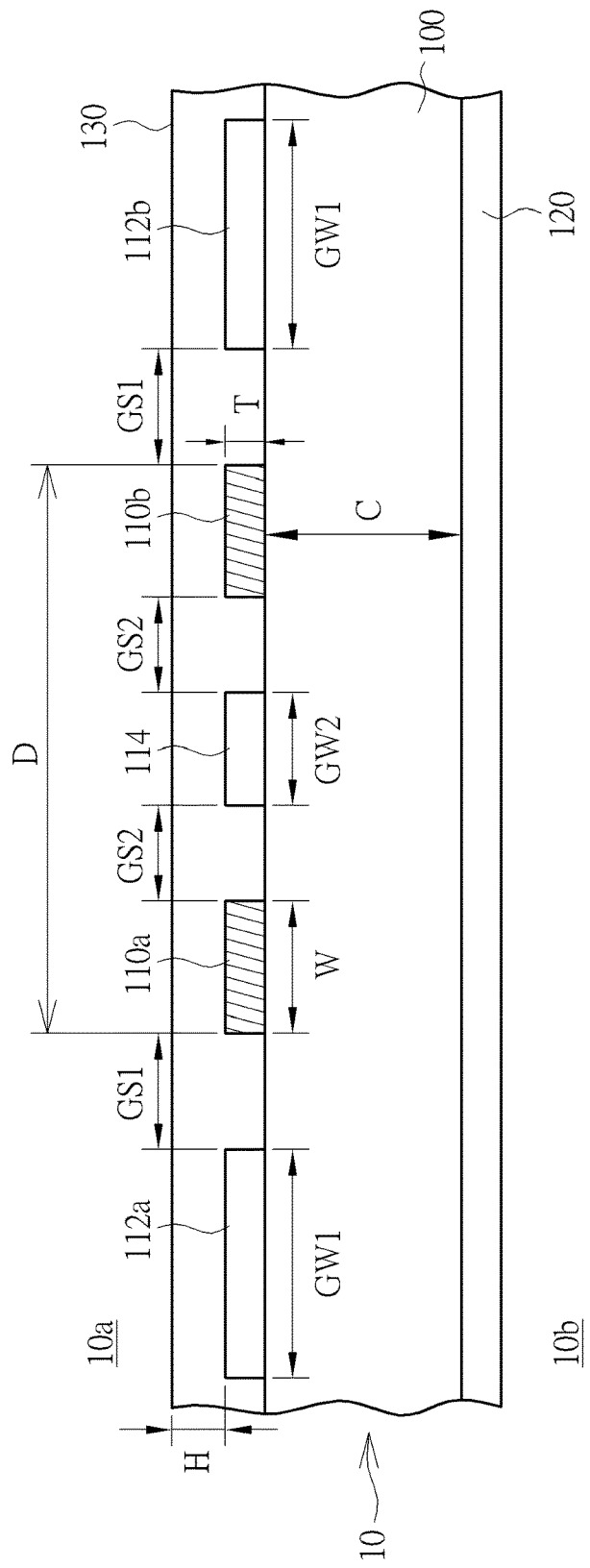
FIG. 1B is a schematic, cross-sectional view taken along line I-I' in FIG. 1A.
Figure 1C:
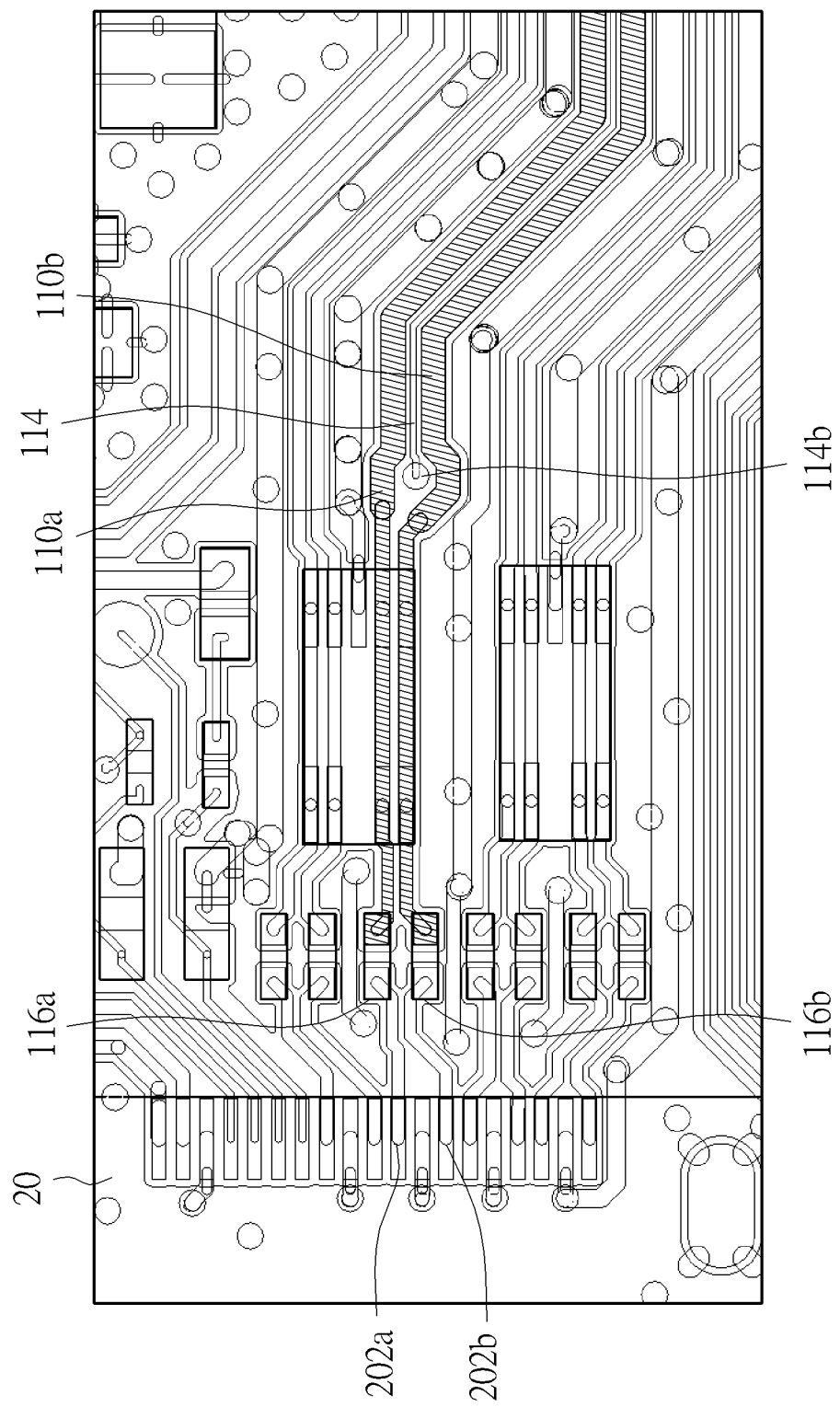
FIG. 1C and FIG. 1D are enlarged view showing respective end portions of the germane differential traces.
Figure 1D:
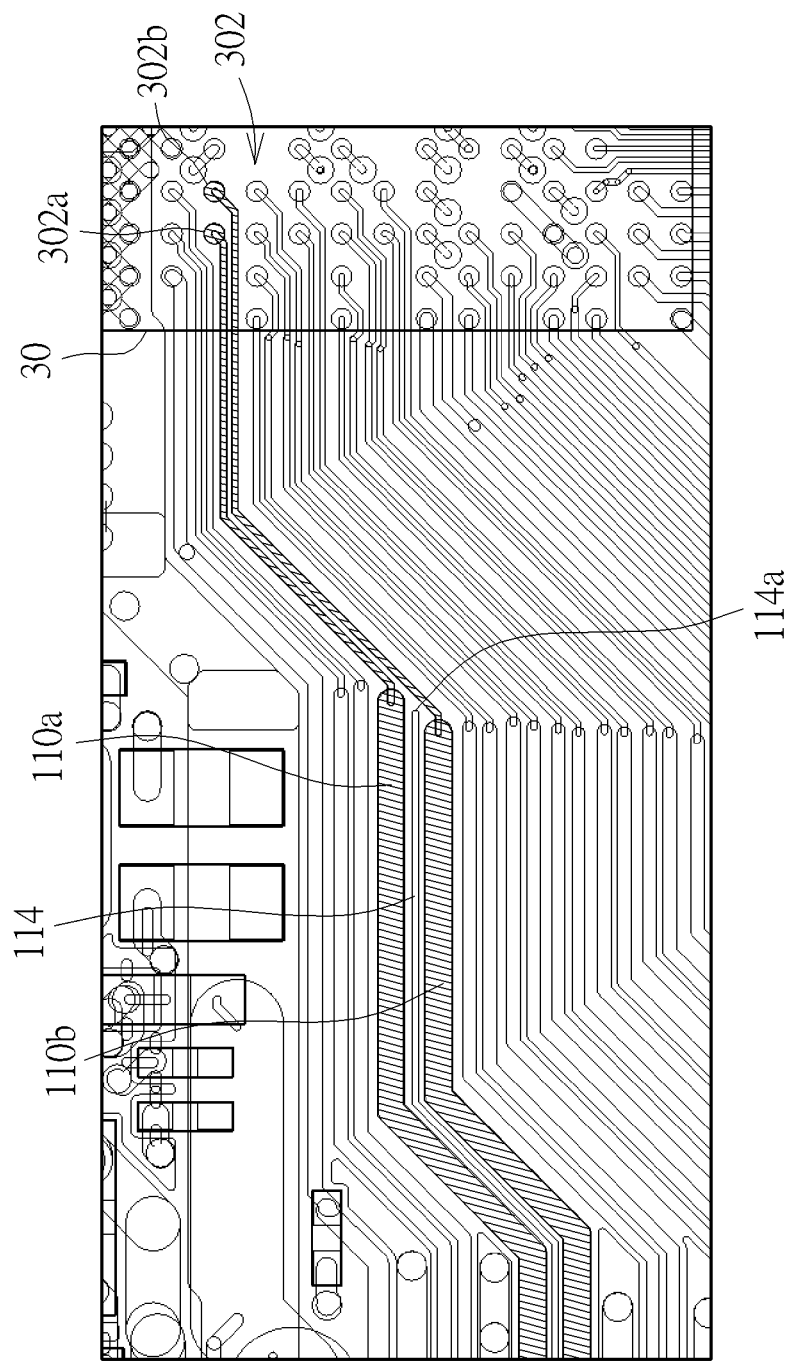

Please refer to FIG. 1A to FIG. 1D. FIG. 1A is a partial plan view of an exemplary 2-layer PCB of an interface device such as an HDMI interface device. FIG. 1B is a schematic, cross-sectional view taken along line I-I' in FIG. 1A. FIG. 1C and FIG. 1D are enlarged view showing respective end portions of the germane differential traces. First, as shown in FIG. 1A and FIG. 1B, the PCB assembly 1 comprises a 2-layer PCB 10 having two opposite surfaces 10a and 10b. The 2-layer PCB 10 may comprise a core substrate 100 made of insulating materials. The core substrate 100 may have a thickness C of greater than about 20 mils, for example, 30~70 mils. On the surface 10a, a plurality of conductive traces 11 are provided. For example, the conductive traces 11 may comprise HDMI bus lines and other signal transmission lines. On the opposite surface 10b, according to one embodiment, at least a ground layer or ground plane 120 may be provided. The conductive traces 11 includes, but not limited to, a pair of differential signal traces 110a and 110b sandwiched by a pair of ground guard lines 112a and 112b with a spacing GS1 between the ground guard line 112a and the differential signal trace 110a and between the ground guard line 112b and the differential signal trace 110b. An intervening reference trace 114 is disposed between the differential signal traces 110a and 110b with a spacing GS2 between the intervening reference trace 114 and the differential signal trace 110a and between the intervening reference trace 114 and the differential signal trace 110b. A solder mask 130 may be coated on the surface 10a to cover the conductive traces 11. According to the embodiment, the thickness T of the conductive traces 11 may be about 1.34 mils, for example. According to the embodiment, the thickness H of the solder mask 130 directly above the traces 11 may be about 0.4 mils, for example. According to the embodiment, the pair of differential signal traces 110a and 110b may have a length greater than or equal to 2 mm.

According to the embodiment, the ground guard lines 112a and 112b both have a line width GW1 of about 20 mils, the differential signal traces 110a and 110b both have a line width W of about 20 mils, and the intervening reference trace 114 may have a line width GW2 of greater than or equal to 3 mils, for example, about 5 mils. According to the embodiment, the spacing GS1 may be about 6 mils, for example. According to the embodiment, the spacing GS2 may be about 4 mils, for example. A channel span D is defined as the combination of the line widths W of the differential signal traces 110a and 110b, the line width GW2 of the intervening reference trace 114, and the spacing GS2 between the intervening reference trace 114 and the differential signal trace 110a and between the intervening reference trace 114 and the differential signal trace 110b. According to the embodiment, for example, the channel span D may be about 53 mils (D=2×W+GW2+2×GS2). With such unique SGS (or GSGSG) configuration, a simulated $Z_{diff}/Z_{com}$ of about 89/27Ω can be achieved (impedance simulation in 2-layer PCB using ANSYS Q2D).

As shown in FIG. 1A and FIG. 1C, the PCB assembly 1 may further comprise a connector region 20. Within the connector region 20, an HDMI connector having corresponding connecting pads or pins 202a and 202b for electrically coupling the differential signal traces 110a and 110b may be provided. In addition, a series resistor (Rs) 116a and a series resistor 116b, or other electrostatic discharge (ESD) protection components, may be added between the connecting pad 202a and the differential signal trace 110a and between the connecting pad 202b and the differential signal trace 110b, respectively. If both the series resistors 116a and 116b are 13Ω resistors, such that $Z_{diff}$ and $Z_{com}$ would be about 115Ω and 33.5Ω, respectively, which both impedances still conform to the MHL specification. According to the embodiment, both the series resistor 116a and the series resistor 116b are 6Ω resistors, such that $Z_{diff}$ and $Z_{com}$ would be about 101Ω and 30Ω, respectively. As can be best seen in FIG. 1C, the intervening reference trace 114 is electrically connected to the ground plane 120 on the opposite surface 10b through a conductive via 114b located near the connector region 20. However, it is to be understood that the intervening reference trace 114 may be electrically connected a power plane in other embodiments. Alternatively, the intervening reference trace 114 may be electrically connected to either a ground pin or a power pin of the HDMI connector within the connector region 20.

As shown in FIG. 1A and FIG. 1D, the PCB assembly 1 may further comprise a chip package mounting region 30 on the other end of the conductive traces 11. Within the chip package mounting region 30, a chip package (not explicitly shown) may be mounted on the surface 10a or the bottom surface 10b of the PCB 10 and electrically coupled to the respective traces 11 on the PCB 10 through the plurality of bond sites, pads 302 or plated through hole (not shown). The detailed structure of the chip package will be discussed later. As can be best seen in FIG. 1D, the differential signal traces 1100a and 110b extends into the chip package mounting region 30 to connect to respective bone sites or pads 302a and 302b. The intervening reference trace 114 may be terminated outside the chip package mounting region 30. However, it is to be understood that the intervening reference trace 114 may extend into the chip package mounting region 30 to connect to a bond pad corresponding to a ground or power lead, pin or ball of the chip package.

Figure 2:
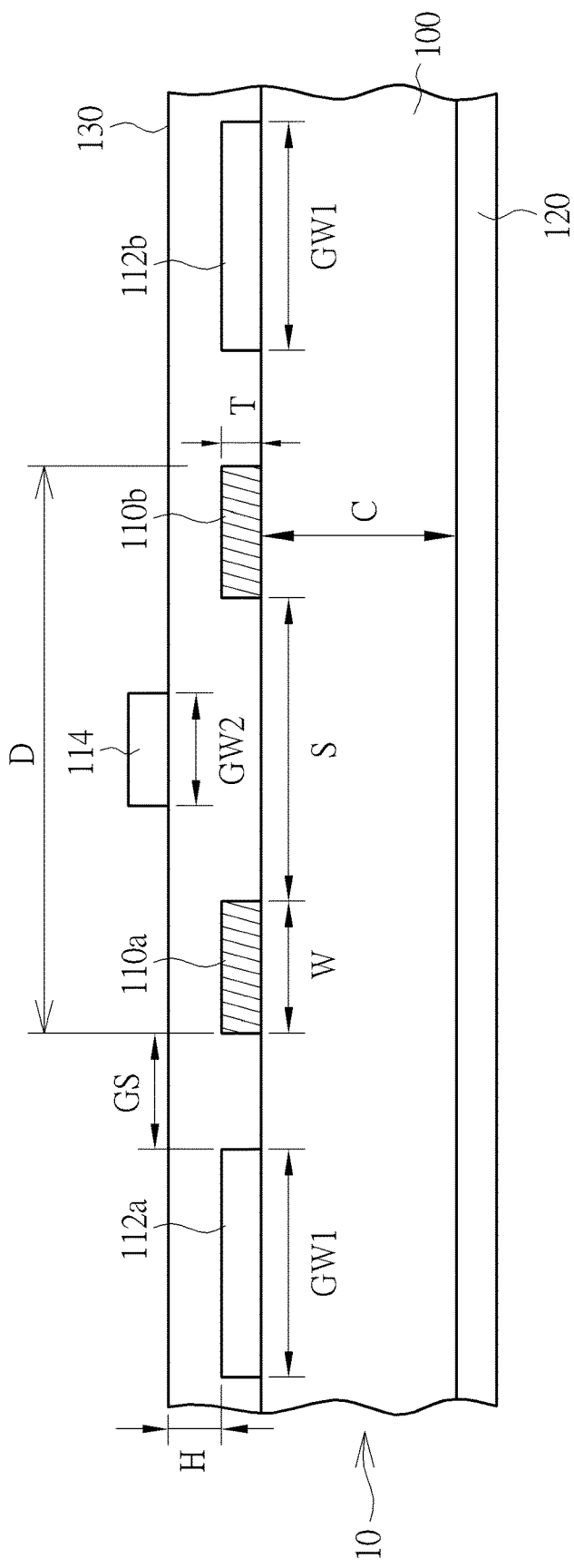
FIG. 2 shows a PCB with the GSGSG pattern wherein the intervening reference trace is in not coplanar with the adjacent high-speed conductive traces.

In FIG. 1A-1D, the intervening reference trace 114 in coplanar with the adjacent conductive traces 11 including the differential signal traces 110a and 110b on the surface 10a of the PCB 10. However, it is to be understood that the intervening reference trace 114 may not be in coplanar with the adjacent conductive traces 11 in other embodiments. As shown in FIG. 2, according to another embodiment, the intervening reference trace 114 may be disposed directly on a top surface of the solder mask 130. For example, the intervening reference trace 114 may be composed of silver paste, conductive carbon materials such as graphite or the like, and may be formed by using printing, coating or any suitable methods. The overlying intervening reference trace 114 may be electrically coupled to a power or ground net. With such configuration including, for example, a channel span D of about 24 mils (W=8 mils; S=8 mils, wherein S is defined as the spacing between the differential signal traces 110a and 110b), GS=6 mils, and GW2=5 mils, a simulated $Z_{diff}/Z_{com}$ of about 93/29Ω can be achieved.

Figure 3:
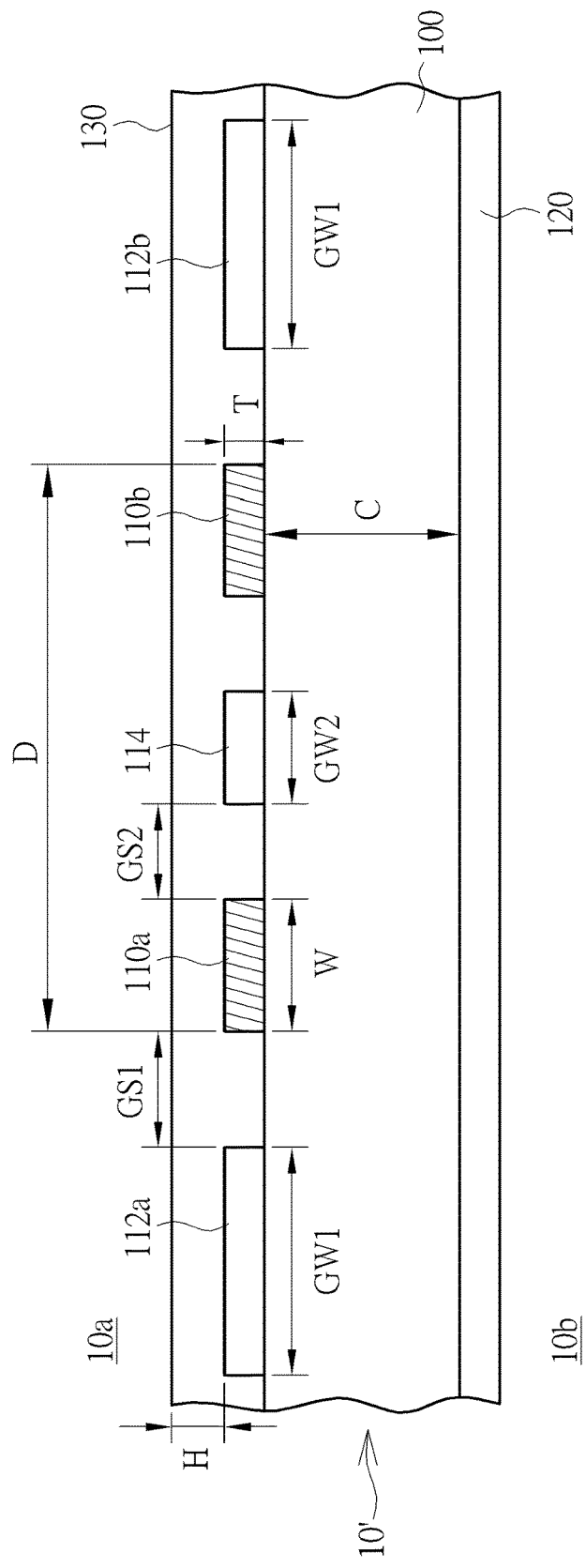
FIG. 3 shows an exemplary 2-layer TFBGA package substrate utilizing the SGS or GSGSG trace pattern.

The above-discussed SGS or GSGSG configuration may be applicable to BGA or 2-layer TFBGA (thin fine-pitch BGA) package substrates. As shown in FIG. 3, according to still another embodiment, the BGA or 2-layer TFBGA package substrate 10' likewise comprises a core substrate 100 made of insulating materials. The core substrate 100 may have a thickness C of 150~600 micrometers, for example, 250 micrometers. On the surface 10a (or component side), a plurality of conductive traces 11 are provided. On the opposite surface 10b (or ball side), according to one embodiment, at least a ground layer or ground plane 120 may be provided. A plurality of BGA ball pads (not shown) may be disposed on the surface 10b. The conductive traces 11 includes, but not limited to, a pair of differential signal traces 110a and 110b sandwiched by a pair of ground guard lines 112a and 112b with a spacing GS1 between the ground guard line 112a and the differential signal trace 110a and between the ground guard line 112b and the differential signal trace 110b. An intervening reference trace 114 is disposed between the differential signal traces 110a and 110b with a spacing GS2 between the intervening reference trace 114 and the differential signal trace 110a and between the intervening reference trace 114 and the differential signal trace 110b. A solder mask 130 may be coated on the surface 10a to cover the conductive traces 11. The thickness T of the conductive traces 11 may be about micrometers, for example. According to the embodiment, the thickness H of the solder mask 130 directly above the traces 11 may be about 30 micrometers, for example. With such configuration including, for example, a channel span D of about 250 micrometers (W=GS2=GW2=50 micrometers), GS1=50 micrometers, and GW1=50 micrometers, a simulated $Z_{diff}$/$Z_{com}$ of about 98/27Ω can be achieved. Compared to the conventional 2-layer TFBGA package substrate, the proposed GSGSG pattern in the 2-layer TFBGA package substrate 10' occupies less routing area due to smaller channel span D (D=2×W+GW2+2×GS2).

The above-discussed SGS configuration may be applicable to leadframe packages such as an exposed die pad (E-pad) leadframe package. The E-pad leadframe package exposes the bottom surface of the die pad to the outside of the encapsulation body. The exposed die pad may act as a heat sink and can improve the heat-dissipation efficiency. Typically, the exposed die pad is electrically connected to a ground plane of the external PCB or mother board. Among others, an E-pad low-profile quad flat package (LQFP) is known as a low-cost solution for multimedia chips.

Figure 4A:
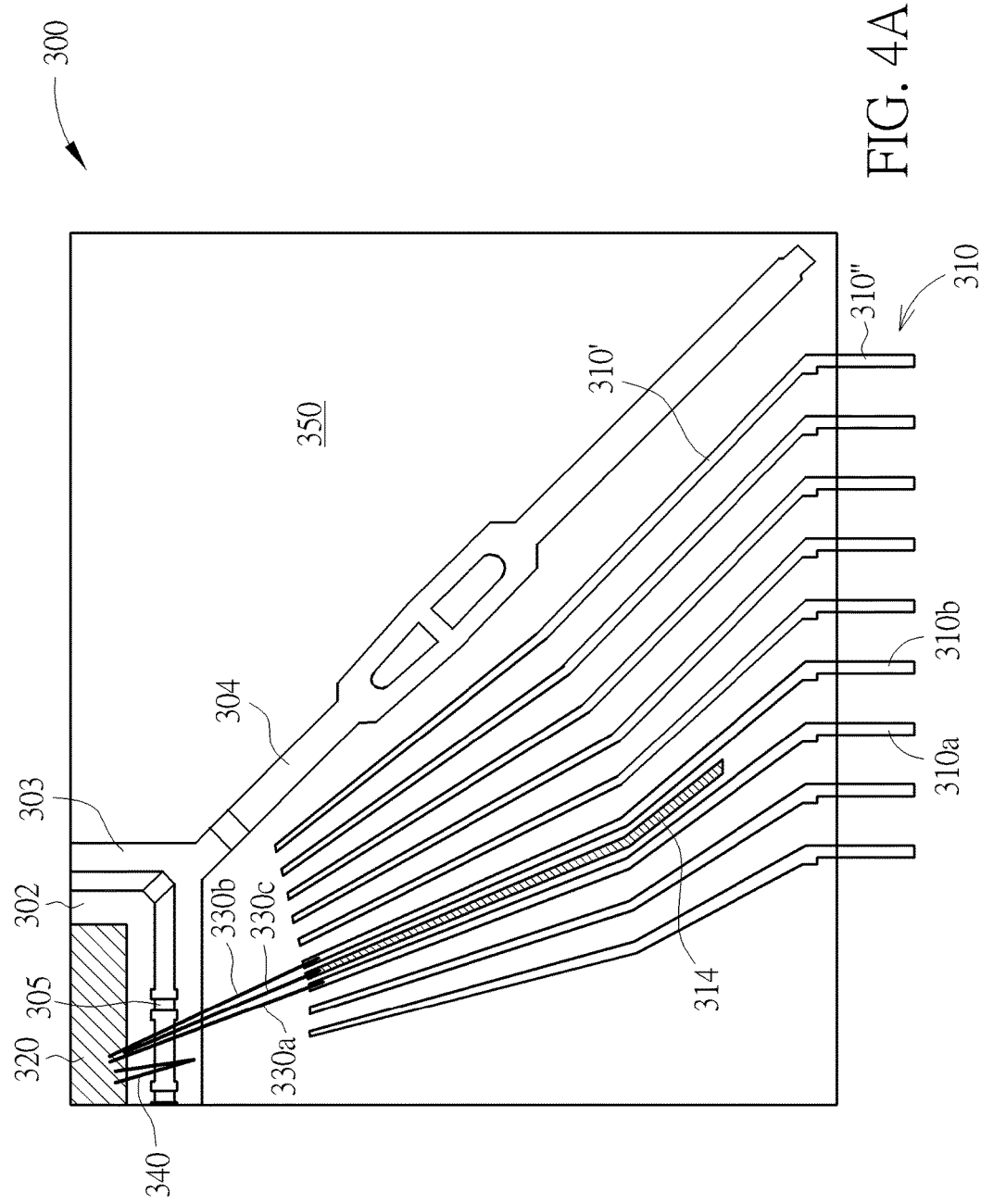
FIG. 4A is a partial top view showing a germane portion of an E-pad leadframe package.
Figure 4B:
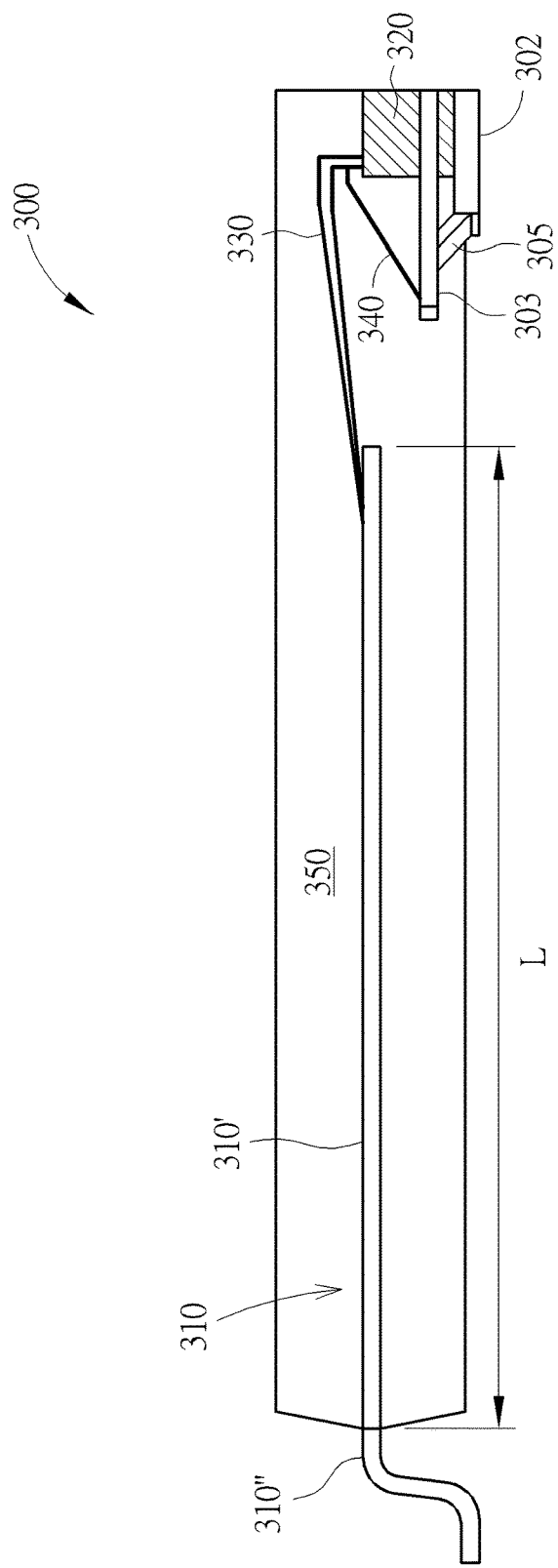
FIG. 4B is a partial sectional view of the leadframe package.
Figure 4C:
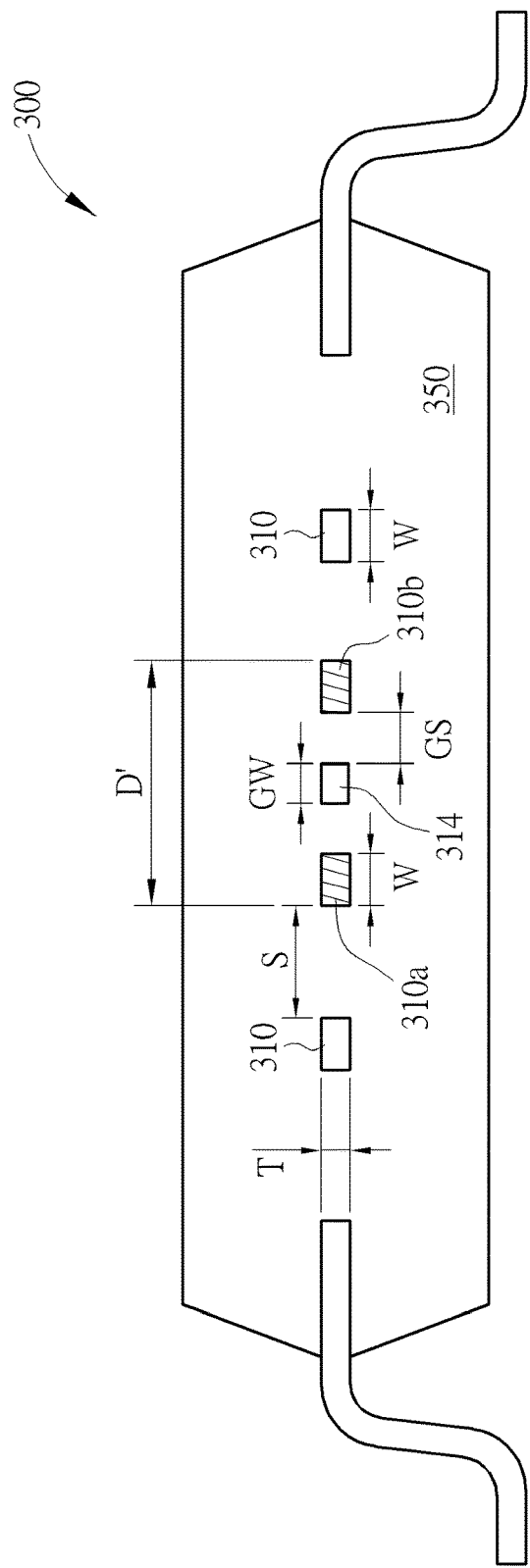
FIG. 4C and FIG. 4D are schematic, sectional views showing the SGS lead configuration within the leadframe package.
Figure 4D:
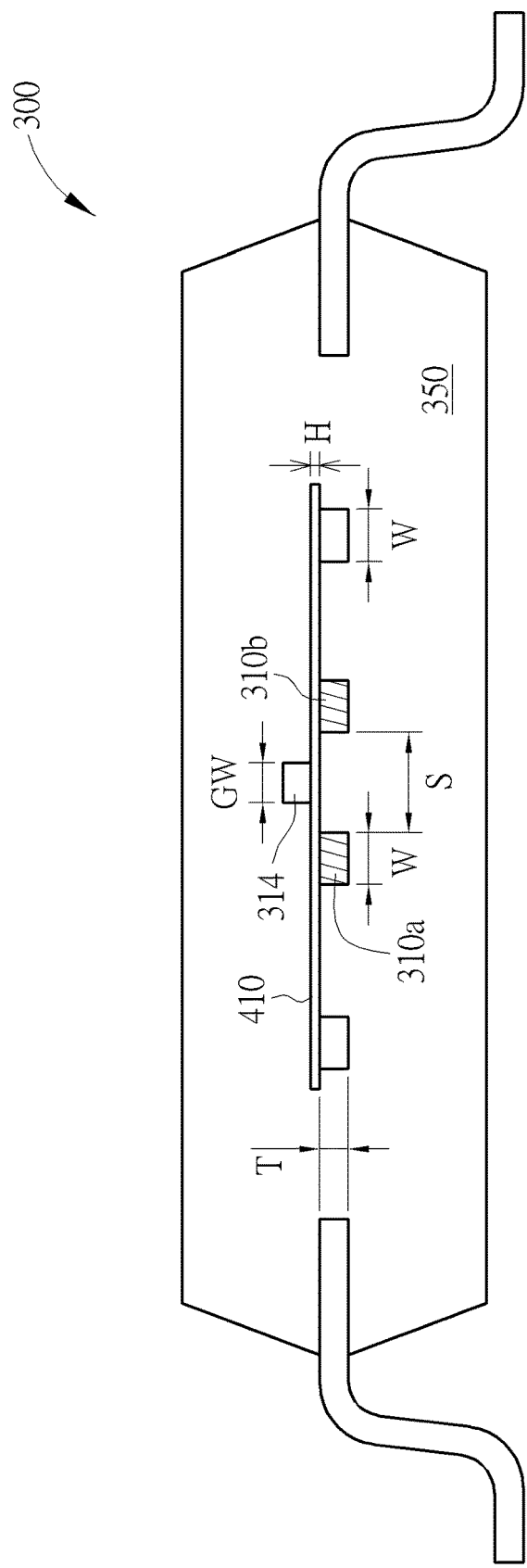

Please refer to FIG. 4A to FIG. 4D. FIG. 4A is a partial top view showing a germane portion of an E-pad leadframe package 300. FIG. 4B is a partial sectional view of the leadframe package 300. FIG. 4C and FIG. 4D are schematic, sectional views showing the SGS lead configuration within the leadframe package. As shown in FIG. 4A and FIG. 4B, the E-pad leadframe package 300 comprises a semiconductor die 320 mounted on a die pad 302 of a metallic leadframe, a plurality of leads 310 disposed in a first horizontal plane along the peripheral edges of the die pad 302, a ground bar 303 downset from the first horizontal plane to a second horizontal plane and connected to the die pad with a downset bridge 305. Taking an example of four tie bars here but not limited to, there are four tie bars 304 extending outward from the four corners of the die pad 302 (only one tie bar is shown). In FIG. 4A, only a portion of the leads 310 within a sector region between two adjacent tie bars are shown for the sake of simplicity.

The E-pad leadframe package 300 further comprises a plurality of bonding wires 330 for electrically connecting the semiconductor die 320 to the leads 310 and a plurality of bonding wires 340 for electrically connecting the ground bar 303 to the respective ground pads (not explicitly shown) of the semiconductor die 320. A molding compound or mold body 350 at least encapsulates the semiconductor die 320, the bonding wires 330 and 340, the inner leads 310' of the leads 310, the ground bar 303, the tie bars 304, and partially the die pad 302 such that the bottom surface of the die pad 302 is exposed within the bottom surface of the molding compound 350. The inner lead 310' is the portion of each of the leads 310 that is embedded within the molding compound 350. The inner lead 310' has a length L. The outer lead 310" is the portion of each of the leads 310 that protrudes from the edges of the molding compound 350.

As can be seen in FIG. 4A, according to one embodiment, the E-pad leadframe package 300 further comprises a reference inner lead 314 intervening between two adjacent, successive high-speed signal leads 310a and 310b operated greater than 1 Gb/s. The high-speed signal leads 310a and 310b are electrically connected to the corresponding signal pads of the semiconductor die 320 through the bonding wires 330a and 330b respectively. The reference inner lead 314 may be electrically connected to a corresponding ground or power pad of the semiconductor die 320 through the bonding wire 330c. In order to achieve better impedance control, preferably, the length L' of the reference inner lead 314 is greater than or equal to about one-third the inner lead length L of the high-speed signal leads 310a and 310b (L: the length of the inner lead of the lead 310a/310b).

As shown in FIG. 4C, exemplary dimensions of the SGS pattern within the leadframe package are shown. The reference inner lead 314 having a line width GW intervenes between the high-speed signal leads 310a and 310b with a spacing GS. The signal leads 310/310a/310b have a line width W and thickness T. For example, the line width GW and W may be 75 micrometers, and the spacing GS may be 100 micrometers, such that a lead span D' is about 425 micrometers (D'=2×W+GW+2×GS). With such configuration including, for example, a channel span D of about 425 micrometers (W=GW=75 micrometers; GS=100 micrometers; T=0.127 mm), a simulated $Z_{diff}$/$Z_{com}$ of about 91/28Ω can be achieved.

As shown in FIG. 4D, according to another embodiment, the reference inner lead 314 is not coplanar with the leads 310 and the high-speed signal leads 310a and 310b. The reference inner lead 314 may be disposed on a lead-lock tape 410 that is transversely attached across a plurality of leads 310 around the die pad. The reference inner lead 314 may be composed of copper, silver paste, conductive carbon materials such as graphite or the like, and may be formed by using printing, coating, plating or any suitable methods. The overlying reference inner lead 314 may be electrically coupled to a power or ground net. With such configuration including, for example, W=75 micrometers; S=100 micrometers, wherein S is defined as the spacing between the high-speed signal leads 310a and 310b; GW=160 micrometers, and H=50 micrometers (H: the thickness of the lead-lock tape 410), a simulated $Z_{com}$ of about 31.6Ω can be achieved.

Although an E-pad leadframe package is demonstrated, it is to be understood that the present invention should not be limited to such applications. For example, the present invention may be applicable to a non-exposed pad leadframe package.

Figure 5A:
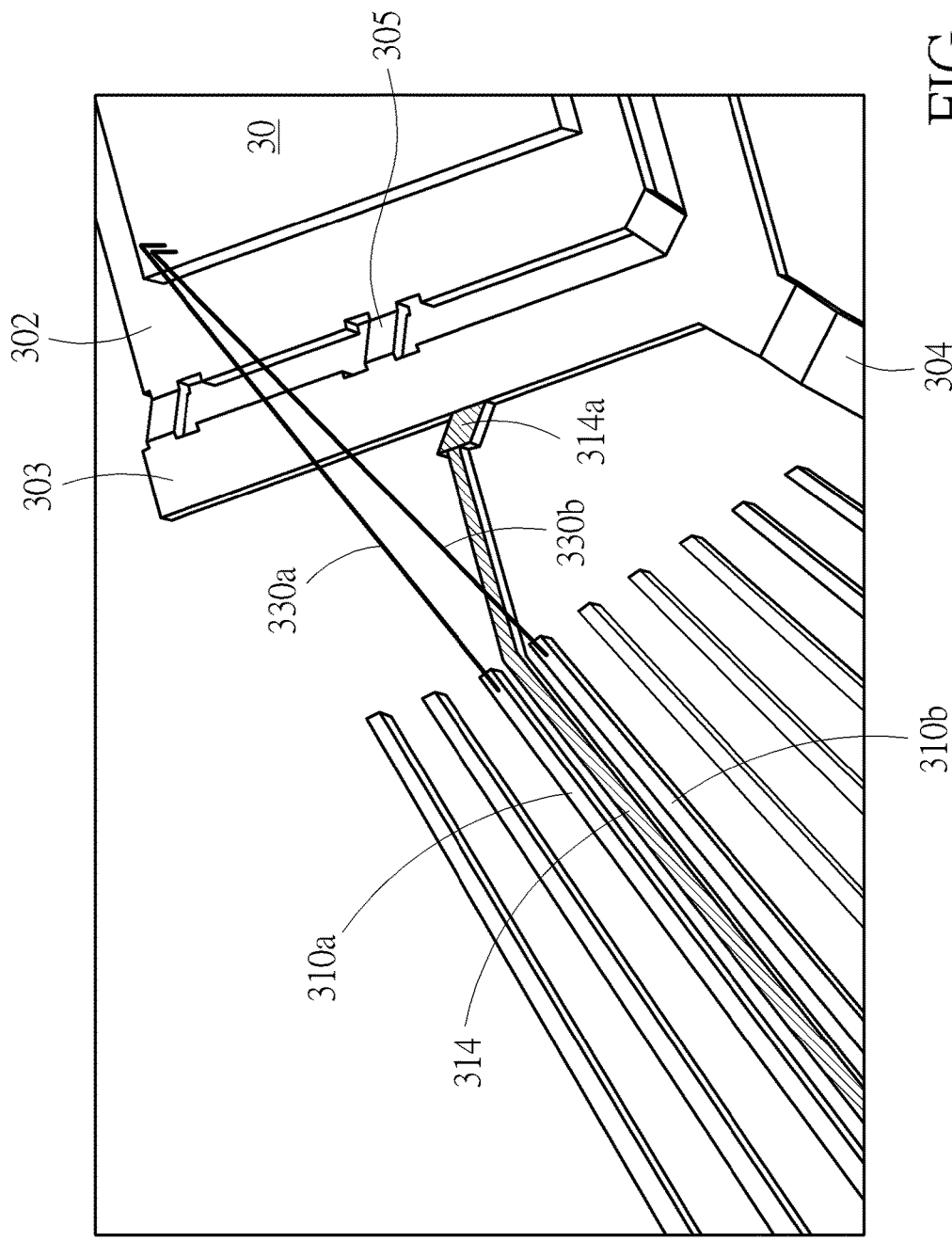
FIG. 5A to FIG. 5C depict various forms of the leadframe package according to embodiments of the invention.
Figure 5B:
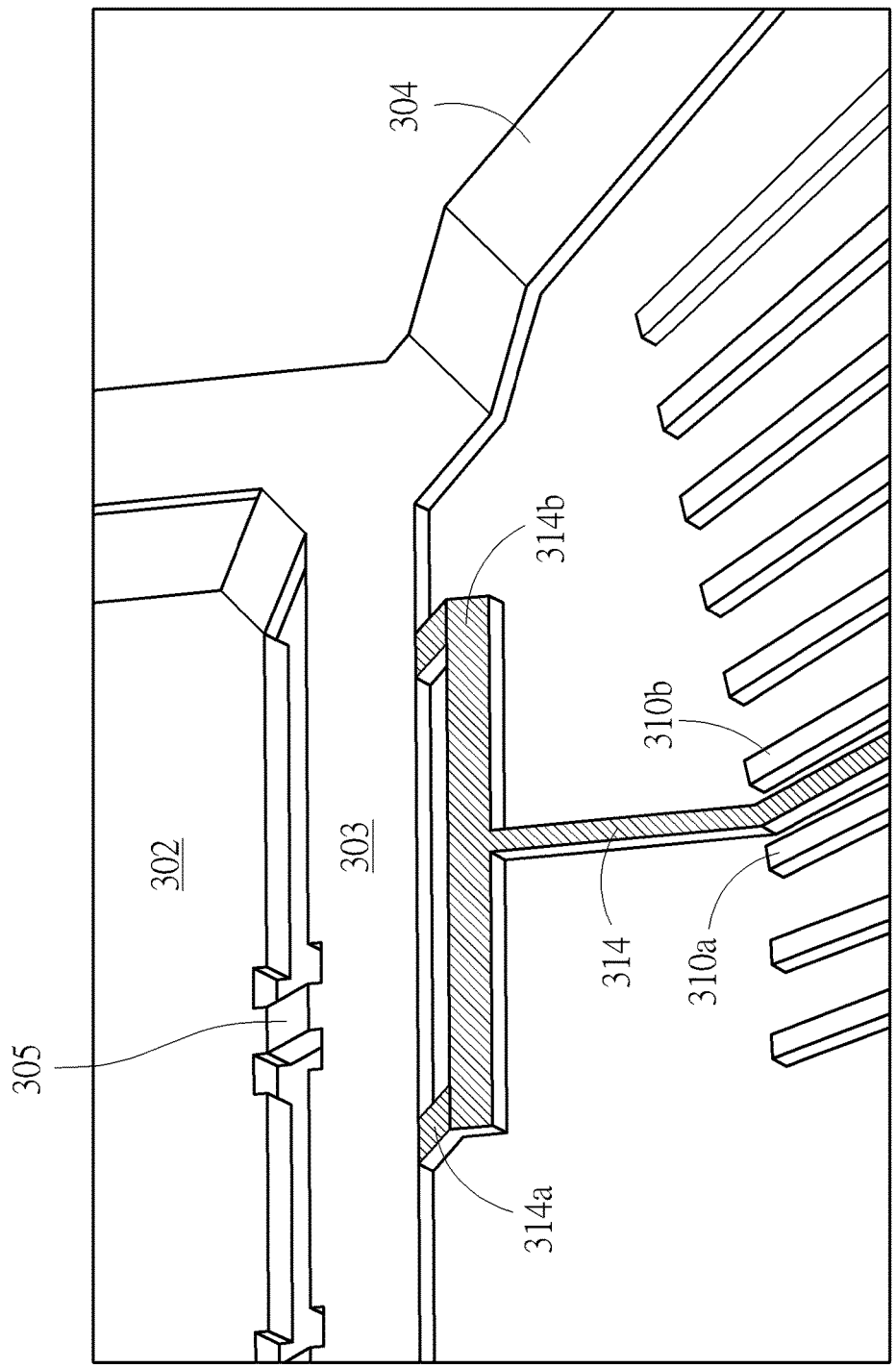
Figure 5C:
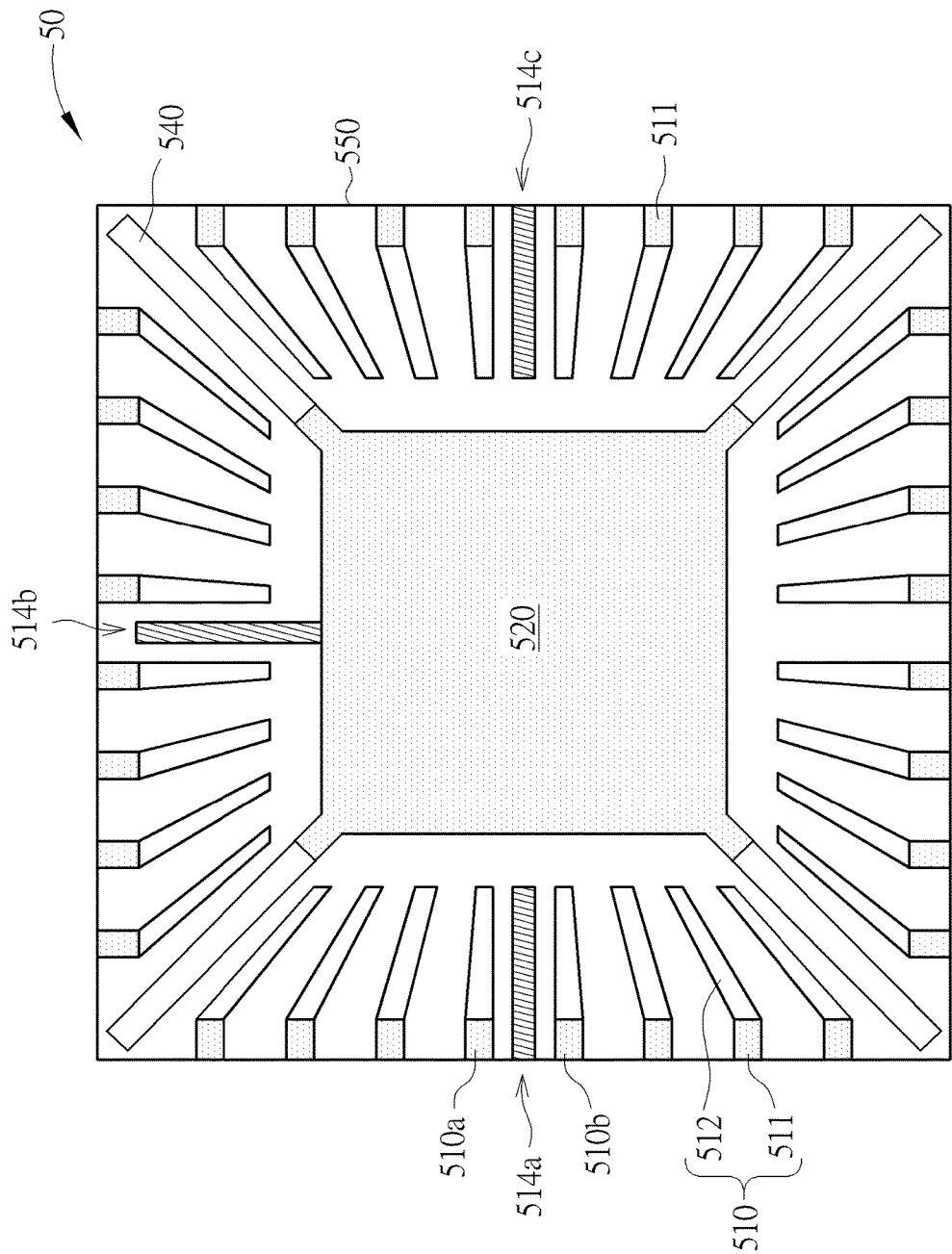

FIG. 5A to FIG. 5C depict various forms of the leadframe package according to embodiments of the invention. As shown in FIG. 5A, the reference inner lead 314 further extends inwardly to joint to the ground bar 303 though a downset bridge 314a. Therefore, the reference inner lead 314 and the ground bar 303 are both grounded. In this case, no bonding wire is needed to connect the reference inner lead 314 to the semiconductor die.

As shown in FIG. 5B, the reference inner lead 314 further extends inwardly to joint to a bar 314b and then joint to the ground bar 303 through at least two bridges 314a. The two bridges 314a provide better support. Alternatively, the reference inner lead 314 may extend laterally to joint to the tie bar 304 in other embodiments. FIG. 5C shows a bottom layout of an exemplary quad-flat non-leaded (QFN) package 50 with the above-discussed SGS pattern.

As shown in FIG. 5C, the QFN package 50 comprises a plurality of leads 510 comprising exposed leads 511 disposed along the four peripheral edges of the exposed die pad 520, a plurality of embedded, half-etched inner leads 512 adjoined to respective exposed leads 510, four tie bars 540, and at least one intervening reference lead 514a between two adjacent, successive high-speed leads 510a and 510b operated greater than 1 Gb/s. Each of the embedded, half-etched inner leads 512 extends from one end of the exposed lead 511 to an opposite second end adjacent to, but spaced apart from, the die pad 520. Like the embedded, half-etched inner leads 512, the intervening reference lead 514*a* is also half-etched and embedded within the molding compound 550. The intervening reference lead 514*a* may be integral with the die pad 520 and may extend to an edge of the package. According to another embodiment, an intervening reference lead 514*b* having one outer end pulled back or withdrawn from the package edge may be provided. Alternatively, the QFN package 50 may be provided with an intervening reference lead 514*c* having an inner end spaced apart from the die pad 520. In this case, the intervening reference lead 514*b* and the intervening reference lead 514*c* may be electrically connected to the die pad by using bonding wires (not shown).

Figure 6:
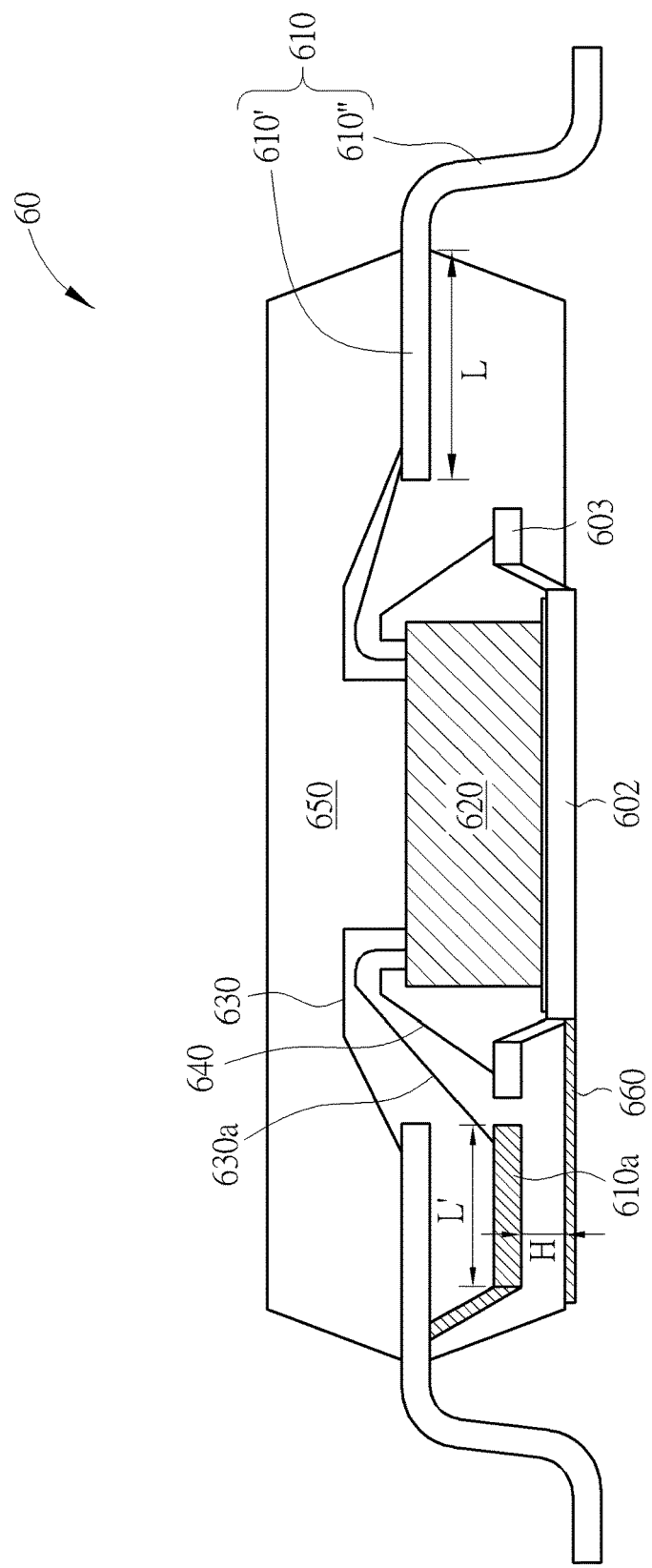
FIG. 6 is a schematic, cross-sectional diagram showing an E-pad leadframe package with an additional ground layer on the bottom surface and downset inner leads.

To further reduce the lead common-mode impedance, an additional ground layer may be incorporated with the exposed die pad of the leadframe package. As shown in FIG. 6, the leadframe package 60 comprises a plurality of leads 610 comprising inner leads 610' with a length L disposed at a first horizontal plane around the die pad 602 and outer leaders bent outside the molding compound 650. A semiconductor chip 620 is mounted on the die pad 602 and is encapsulated by the molding compound 650. The leadframe package 60 further comprises a ground bar 603 downset from the first horizontal plane to a second horizontal plane. A plurality of bonding wires 630 are used to electrically connect the inner leads 610' to the respective input/output pads (not shown) of the semiconductor die 620. At least one bonding wire 640 is provided to electrically connect the ground bar 603 to the ground pad (not shown) of the semiconductor die 620. An extended metal layer 660 is provided on the bottom surface of the leadframe package 60 and may be contiguous with the die pad 602. The metal layer 660 may be composed of copper, silver paste, conductive carbon materials such as graphite or the like, and may be formed by using printing, coating, plating, sputtering or any suitable methods. Therefore, the extended metal layer 660 and the die pad 602 may have the same voltage level, for example, ground level. At least one inner lead 610*a* such as a high-speed or high-frequency lead operated greater than 1 Gb/s is depressed and downset from the first horizontal plane to, for example, the second horizontal plane such that the distance H between the downset inner lead 610*a* and the extended metal layer 660 is preferably less than 0.5 mm. Preferably, the length L' of the downset inner lead 610*a* is greater than or equal to one-third the length L.

Figure 7A:
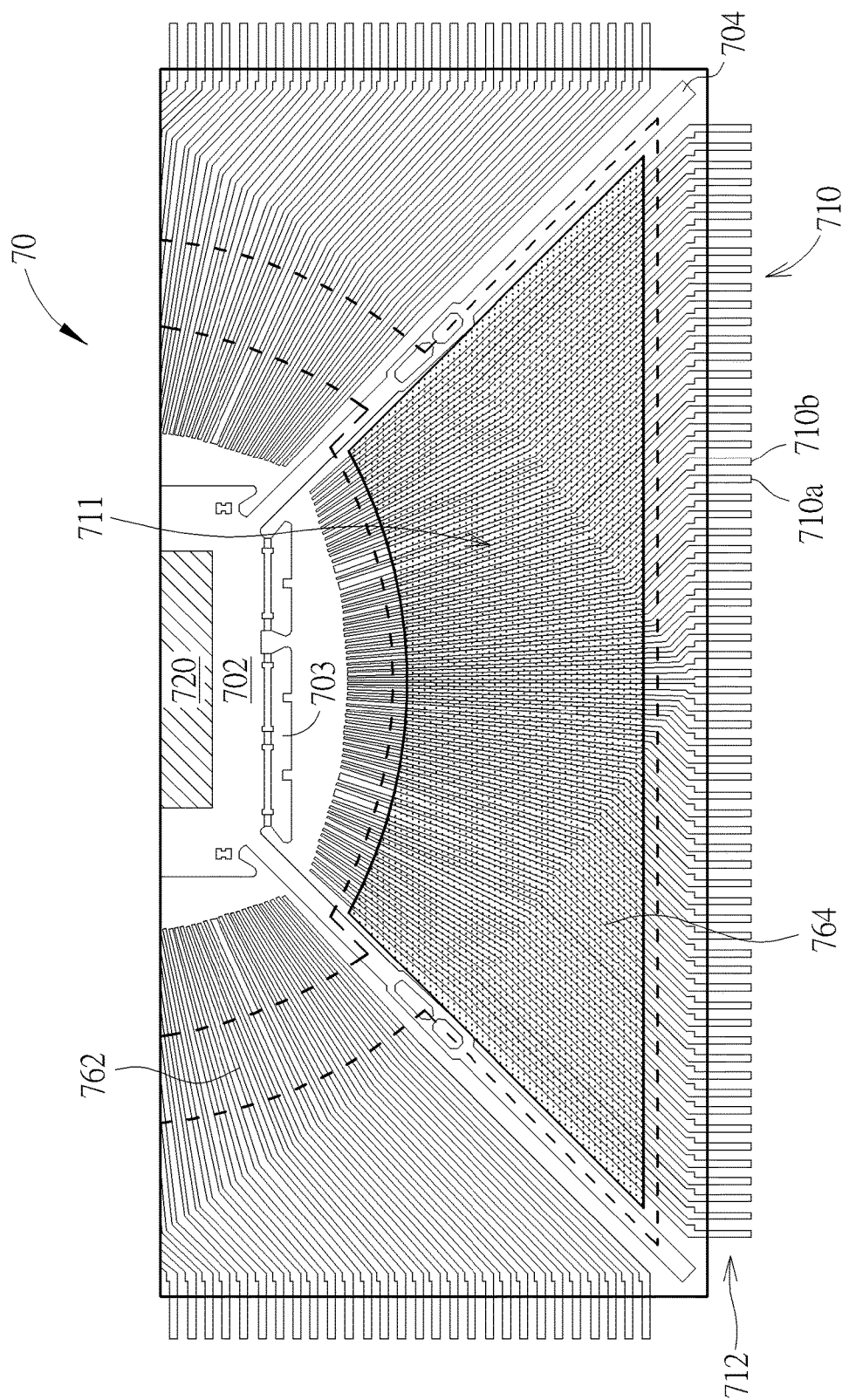
FIG. 7A is a partial top view showing an additional ground layer incorporated with the lead-lock tape.
Figure 7B:
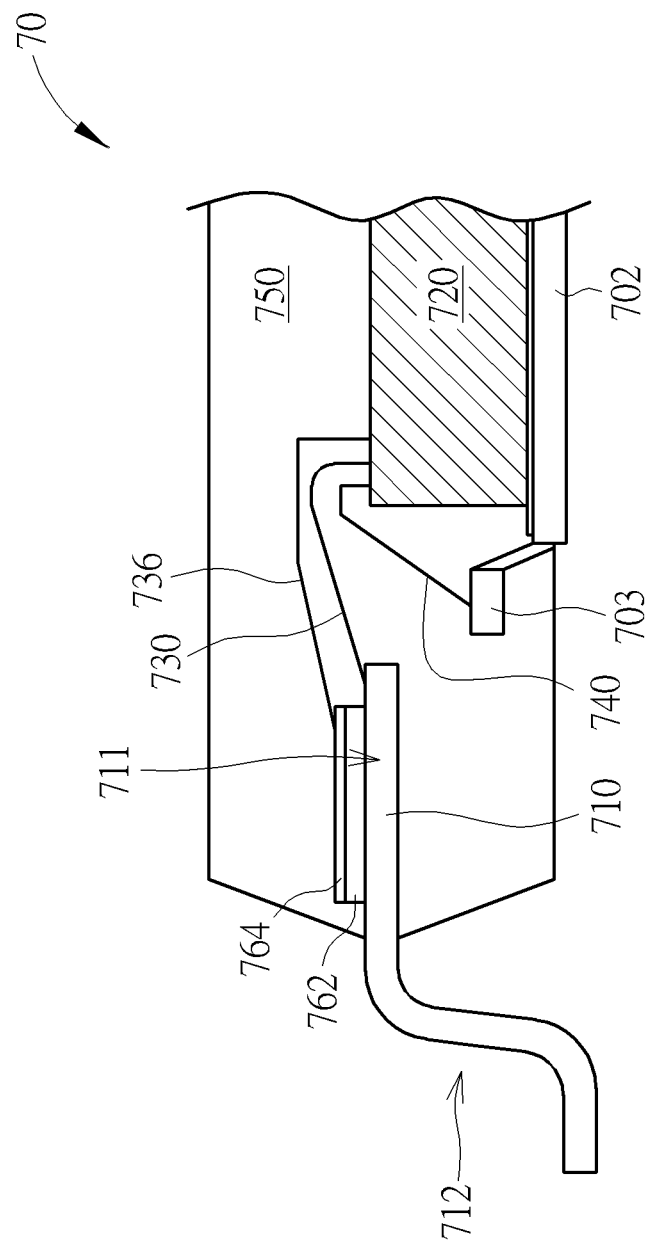
FIG. 7B is a partial cross-sectional view showing the related position of the additional ground layer and the lead-lock tape within the leadframe package of FIG. 7A.
Figure 7C:
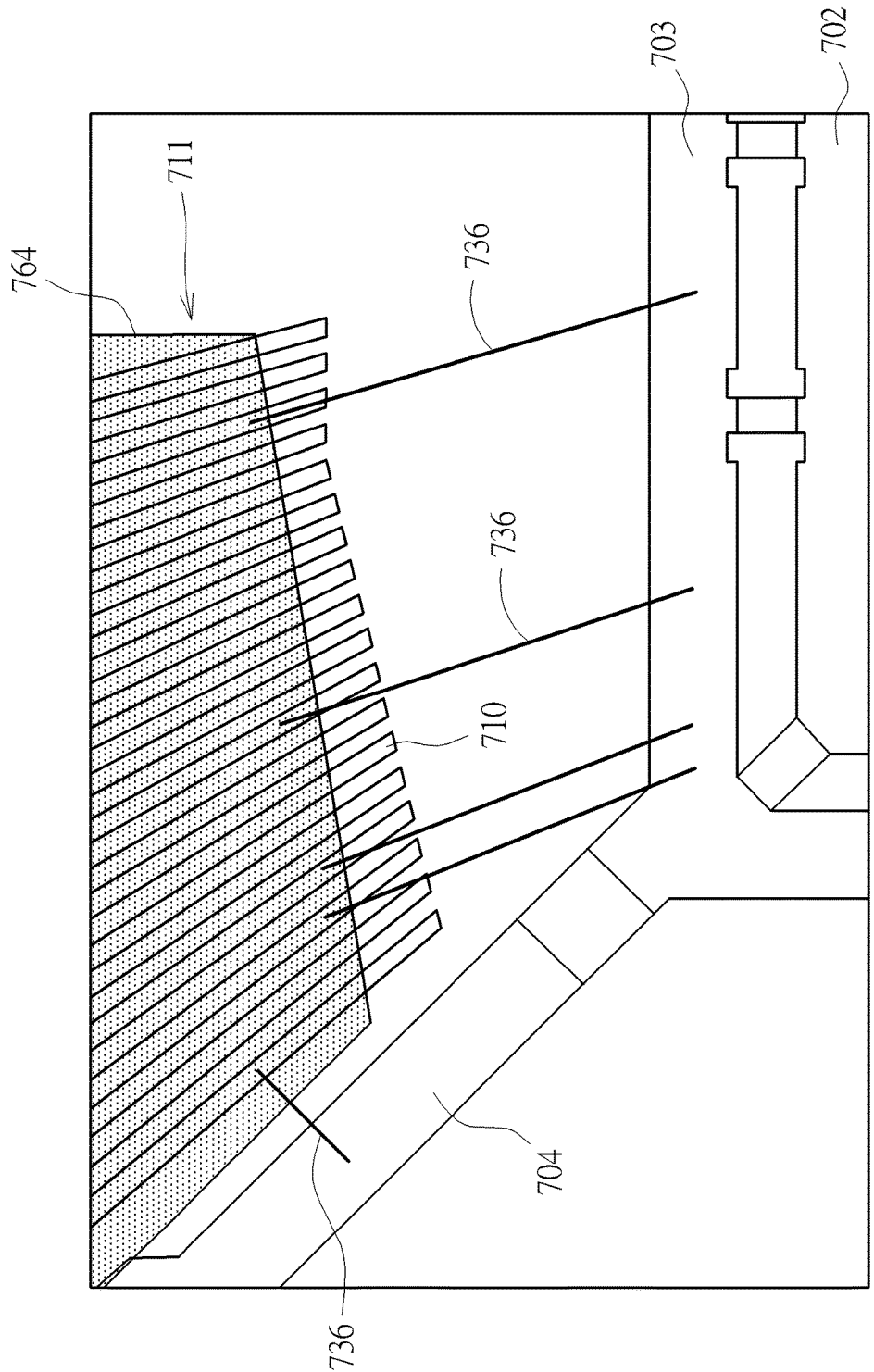
FIG. 7C is an enlarged view showing the bonding wires for electrically connecting the metal layer above the lead-lock tape to the tie bar or ground bar.

The additional ground plane may be incorporated within the leadframe package and may be embedded within the molding compound. As shown in FIG. 7A and FIG. 7B, likewise, the leadframe package 70 comprises a plurality of leads 710 disposed at a first horizontal plane around the die pad 602 supported by the tie bars 704. In some cases, each lead 710 may comprises at least an inner lead 711 and an outer lead 712. A semiconductor chip 720 is mounted on the die pad 702 and is encapsulated by the molding compound 750. The leadframe package 70 further comprises a ground bar 703 downset from the first horizontal plane to a second horizontal plane. A plurality of bonding wires 730 are used to electrically connect the inner leads 711 to the respective input/output pads (not shown) of the semiconductor die 720. At least one bonding wire 740 is provided to electrically connect the ground bar 703 to the ground pad (not shown) of the semiconductor die 720. A lead-lock tape 762 is transversely attached across a plurality of inner leads 711 around the die pad 702. A metal layer 764 is disposed on the lead-lock tape 762, and at least one bonding wire 736 is used to electrical connect the metal layer 764 to ground net in the semiconductor die 720. In FIG. 7A, the metal layer 764 has substantially a sector shape that overlaps with the high-speed or high-frequency inner leads 710*a* and 710*b* within this sector operated greater than 1 Gb/s. Preferably, at least one third of length of the inner lead is covered with the metal layer 764. Further, it is to be understood that the metal layer 764 may be connected to ground by using various means, for example, the metal layer 764 may be connected to tie bars, wire-bonded to ground bars, ground leads using bonding wires, jumpers, straps or epoxy metals. The metal layer 764 may be solid metal, meshed metal or hybrid metal. Moreover, the lead-lock tape 762 may comprise through holes to increase the mold lock strength. As shown in FIG. 7C, the bonding wire 736 are provided for electrically connecting the metal layer 764 above the lead-lock tape to the tie bar 704 or ground bar 703. Preferably, the bonding wire 736 is jointed to the metal layer 764 at a position that is directly above an inner lead.

Figure 8:
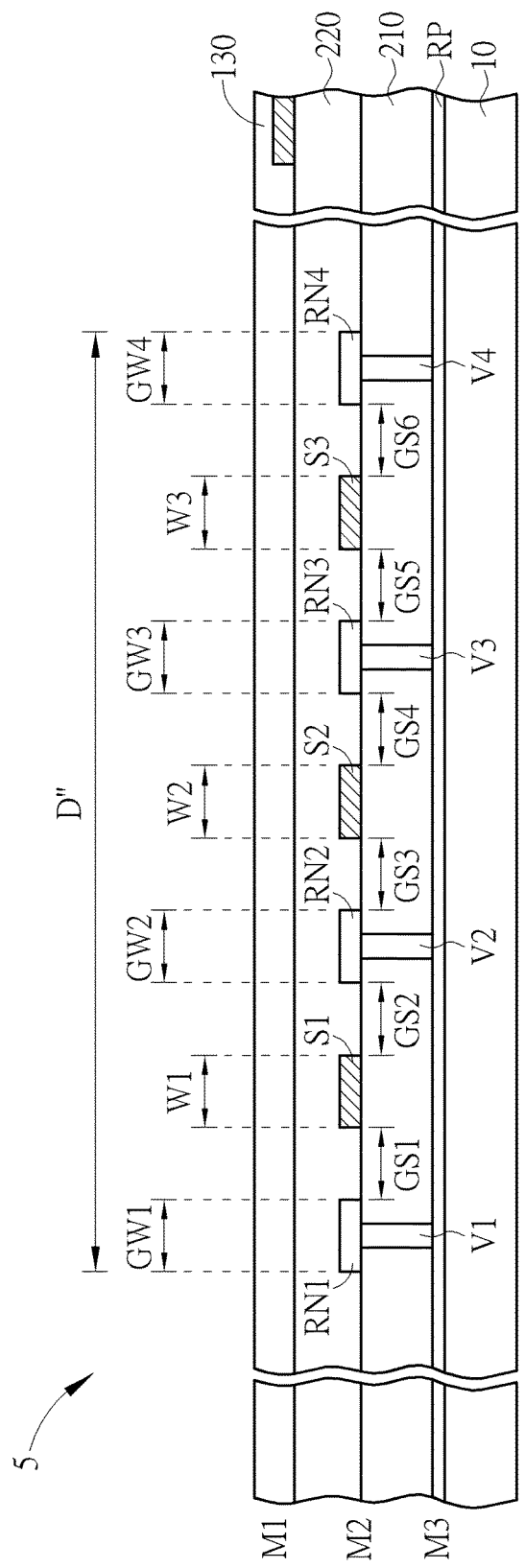
FIG. 8 is a schematic, cross-sectional view showing a substrate having multiple metal layers according to another embodiment of the invention.

FIG. 8 is a schematic, cross-sectional view showing a substrate according to another embodiment of the invention. According to the embodiment of the invention, as shown in FIG. 8, a substrate 5 having multiple metal layers is illustrated. For example, the substrate 5 may be a multi-layer PCB such as an 8-layer PCB with 1+6+1 stack-up, a multi-layer HDI (High-Density Interconnect) PCB, an Any-layer HDI, or a package substrate, but is not limited thereto. It is to be understood that the channel structure illustrated in FIG. 8 may be suited for applications where high-speed or high-frequency signaling and data transmission channel with reduced horizontal span is required.

For example, the substrate 5 may comprise a core substrate 10. At least three metal layers M1~M3 in different levels are disposed on one side of the core substrate 10. For the sake of simplicity, the metal traces embedded in the core substrate 10 are not explicitly shown in FIG. 8. Although not shown in this figure, it is to be understood that there may be multiple metal layers disposed on the other side of the core substrate 10. The core substrate 10 may comprise copper traces, which are patterned on an insulating core material layer including, but not limited to, FR-4 epoxy dielectric.

As shown in FIG. 8, the three metal layers comprise a lower metal layer M3, a middle metal layer M2 situated overlying the lower metal layer M3, and an upper metal layer M1 situated overlying the middle metal layer M2. According to the embodiment of the invention, a reference plane RP is arranged in the lower metal layer M3. The reference plane RP may be electrically connected to ground or power. An insulating build-up layer 210 is laminated on the lower metal layer M3 and the reference plane RP. For example, the insulating build-up layer 210 may comprise prepreg (pre-impregnated) material such as 2113 prepreg, but is not limited thereto. The prepreg material is a thin sheet of fiberglass impregnated with uncured epoxy resin which hardens when heated and pressed during the PCB or package substrate fabrication process.

According to the embodiment of the invention, a trio of signal traces that is composed of a first signal trace S1, a second signal trace S2, and a third signal trace S3 is arranged in the middle metal layer M2 and on the insulating build-up layer 210. According to the embodiment of the invention, the trio of signal traces comprises at least a pair of differential signal traces. According to the embodiment of the invention, the trio of signal traces may be operated greater than 1 Gb/s. According to the embodiment of the invention, the first signal trace S1, the second signal trace S2, and the third signal trace S3 are coplanar and are arranged with a pitch of 400 micrometers.

According to the embodiment of the invention, a plurality of reference nets RN1~RN4 is arranged in the middle metal layer M2. The plurality of reference nets RN1~RN4 may be electrically connected to ground or power. According to the embodiment of the invention, the trio of signal traces S1~S3 and the plurality of reference nets RN1~RN4 are coplanar. The first signal trace S1, the second signal trace S2, and the third signal trace S3 are separated by the plurality of reference nets RN1~RN4. The first signal trace S1 is interposed between the reference net RN1 and the reference net RN2, the second signal trace S2 is interposed between the reference net RN2 and the reference net RN3, and the third signal trace S3 is interposed between the reference net RN3 and the reference net RN4.

An insulating build-up layer 220 is laminated on the middle metal layer M2. For example, the insulating build-up layer 220 may comprise prepreg material such as 2113 prepreg, but is not limited thereto. The upper metal layer M1 is disposed on the insulating build-up layer 220. A solder mask 130 covers the upper metal layer M1 and the exposed upper surface of the insulating build-up layer 220.

In FIG. 8, a horizontal span D" is defined as the lateral distance or horizontal distance between an outer edge of the reference net RN1 and an outer edge of the reference net RN4, which is equal to the combination of the line widths W1, W2, and W3 of the signal traces S1~S3, the line widths GW1, GW2, GW3, and GW4 of the reference nets RN1~RN4, and the spacing GS1, GS2, GS3, GS4, GS5, GS6 between the reference nets RN1~RN4 and the signal traces S1~S3. According to the embodiment, preferably, the spacing GS2 is equal to or greater than the line width GW1.

According to the embodiment, for example, the line widths W1, W2, and W3 of the signal traces S1~S3 may be 100 micrometers. According to the embodiment, for example, the line widths GW1, GW2, GW3, and GW4 of the reference nets RN1~RN4 may be 100 micrometers. According to the embodiment, for example, the spacing GS1, GS2, GS3, GS4, GS5, GS6 between the reference nets RN1~RN4 and the signal traces S1~S3 may be 100 micrometers. According to the embodiment, for example, the horizontal span D" may be about 1200 micrometers. According to the embodiment, the horizontal span D" is preferably smaller than or equal to 3000 micrometers, which is smaller than that of signal traces S1~S3 arranged in the upper metal layer M1. Thus the routing density of signal traces can be increased.

According to the applications with better signal quality, the differential-mode impedances $Z_{diff}$ (S1, S2), $Z_{diff}$ (S3, S1), and $Z_{diff}$ (S2, S3) of the trio of signal traces should range between 85Ω and 115Ω (85Ω≤$Z_{diff}$ (S1, S2), $Z_{diff}$ (S3, S1), and $Z_{diff}$ (S2, S3)≤115Ω). The target differential-mode impedance ($Z_{diff}$) is 100Ω. The common-mode impedances $Z_{com}$ (S1, S2), $Z_{com}$ (S3, S1), and $Z_{com}$ (S2, S3) of the trio of signal traces should range between 20Ω and 30Ω (20Ω≤$Z_{com}$ (S1, S2), $Z_{com}$ (S3, S1), and $Z_{com}$ (S2, S3)≤30Ω). The target common-mode impedance ($Z_{com}$) is 25Ω. The target single-ended impedance ($z_0$) is 50Ω.

According to the simulation results of the embodiment for dual coupled impedance (impedance simulation using ANSYS Q2D), a single-ended impedance $Z_0$ of about 49.1Ω can be achieved. A simulated $Z_{diff}$ (S1, S2) of about 96.4Ω, a simulated $Z_{diff}$ (S3, S1) of about 97.8Ω, and a simulated $Z_{diff}$ (S2, S3) of about 96.4Ω can be achieved. A simulated $Z_{com}$ (S1, S2) of about 25.0Ω, a simulated $Z_{com}$ (S3, S1) of about 24.6Ω, and a simulated $Z_{com}$ (S2, S3) of about 25.0Ω can be achieved.

According to the embodiment of the invention, in the region directly above the horizontal span D" between the first signal trace S1 and the third signal trace S3, no metal trace or plane is disposed in the upper metal layer M1. In addition, the reference nets RN1~RN4 may be electrically connected to the reference plane RP through the conductive vias V1~V4, respectively. According to the embodiment of the invention, the conductive vias V1~V4 are formed in the insulating build-up layer 210.

The trio signal trace layout as depicted in FIG. 8 and the subsequent figures may be applicable to the situation as described in FIGS. 1A, 1C and 1D for fulfilling the multi-wire signaling scheme (i.e., signaling over more than two wires) connection between the connector region 20 and the chip package mounting region 30. The trio of three signal traces S1~S3 may also be referred to as a "lane" that enables data transmission of up to 2.28 bits per symbol.

Figure 9:
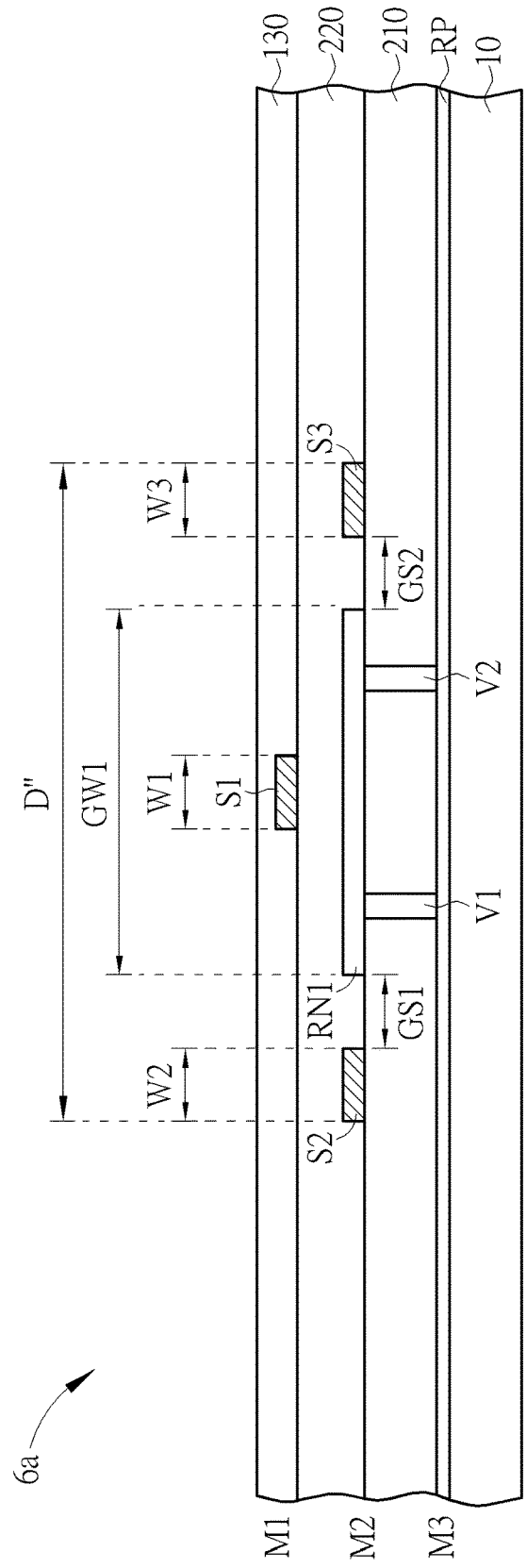
FIG. 9 is a schematic, cross-sectional view showing a substrate having multiple metal layers according to another embodiment of the invention.

FIG. 9 is a schematic, cross-sectional view showing a substrate according to another embodiment of the invention, wherein like numeral numbers designate like layers, regions, or elements. According to the embodiment of the invention, as shown in FIG. 9, a substrate 6a having multiple metal layers is illustrated. For example, the substrate 6a may be a multi-layer PCB such as an 8-layer PCB with 1+6+1 stack-up, a multi-layer HDI PCB, an Any-layer HDI, or a package substrate, but is not limited thereto. It is to be understood that the channel structure illustrated in FIG. 9 may be suited for applications where high-speed or high-frequency signaling and data transmission channel with reduced horizontal span is required.

Likewise, the substrate 6a may comprise a core substrate 10. At least three metal layers M1~M3 in different levels are disposed on one side of the core substrate 10. For the sake of simplicity, the metal traces embedded in the core substrate 10 are not explicitly shown in FIG. 9. Although not shown in this figure, it is to be understood that there may be multiple metal layers disposed on the other side of the core substrate 10. The core substrate 10 may comprise copper traces, which are patterned on an insulating core material layer including, but not limited to, FR-4 epoxy dielectric.

As shown in FIG. 9, the three metal layers comprise a lower metal layer M3, a middle metal layer M2 situated overlying the lower metal layer M3, and an upper metal layer M1 situated overlying the middle metal layer M2. According to the embodiment of the invention, a reference plane RP is arranged in the lower metal layer M3. The reference plane RP may be electrically connected to ground or power. An insulating build-up layer 210 is laminated on the lower metal layer M3 and the reference plane RP. For example, the insulating build-up layer 210 may comprise prepreg material such as 2113 prepreg, but is not limited thereto.

According to the embodiment of the invention, a trio of signal traces that is composed of a first signal trace S1, a second signal trace S2, and a third signal trace S3 is arranged in the upper metal layer M1 and the middle metal layer M2. According to the embodiment of the invention, the trio of signal traces comprises at least a pair of differential signal traces. According to the embodiment of the invention, the trio of signal traces may be operated greater than 1 Gb/s. According to the embodiment of the invention, the second signal trace S2 and the third signal trace S3 are coplanar.

According to the embodiment of the invention, a reference net RN1 is arranged in the middle metal layer M2. The reference net RN1 may be electrically connected to ground or power. According to the embodiment of the invention, the second signal trace S2, the third signal trace S3 and the reference net RN1 are coplanar. The second signal trace S2, and the third signal trace S3 are separated by the reference net RN1. The reference net RN1 is interposed between the second signal trace S2 and the third signal trace S3.

An insulating build-up layer 220 is laminated on the middle metal layer M2. For example, the insulating build-up layer 220 may comprise prepreg material such as 2113 prepreg, but is not limited thereto. The insulating build-up layer 220 covers the second signal trace S2, the third signal trace S3 and the reference net RN1. The upper metal layer M1 is disposed on the insulating build-up layer 220. A solder mask 130 covers the upper metal layer M1 and the exposed upper surface of the insulating build-up layer 220.

In FIG. 9, a horizontal span D" is defined as the lateral distance or horizontal distance between an outer edge of the second signal trace S2 and an outer edge of the third signal trace S3, which is equal to the combination of the line widths W2 and W3 of the signal traces S2, S3, the line widths GW1 of the first reference net RN1, and the spacing GS1, GS2 between the reference net RN1 and the signal traces S2, S3.

According to the embodiment, for example, the line width W1 of the first signal trace S1 may be 100 micrometers and the line widths W2 and W3 of the signal trace S2~S3 may be 114 micrometers. According to the embodiment, the line width W1 of the first signal trace S1 is smaller than or equal to that of the reference net RN1. For example, the line width GW1 of the reference net RN1 may be 400 micrometers. According to the embodiment, for example, the spacing GS1, GS2 between the reference net RN1 and the signal traces S2~S3 may be 100 micrometers. According to the embodiment, for example, the horizontal span D" may be about 828 micrometers. According to the embodiment, the horizontal span D" is smaller than or equal to 3000 micrometers, and the routing density of signal traces can be increased.

According to the simulation results of the embodiment for dual coupled impedance (impedance simulation using ANSYS Q2D), a single-ended impedance $Z_0$ of about 49.8Ω~50.1Ω can be achieved. A simulated $Z_{diff}$(S1, S2) of about 95.2Ω, a simulated $Z_{diff}$(S3, S1) of about 96.2Ω, and a simulated $Z_{diff}$(S2, S3) of about 99.5Ω can be achieved. A simulated $Z_{com}$ (S1, S2) of about 26.0Ω, a simulated $Z_{com}$ (S3, S1) of about 26.1Ω, and a simulated $Z_{com}$ (S2, S3) of about 25.2Ω can be achieved.

According to the embodiment, the reference net RN1 may be electrically connected to the reference plane RP through the conductive vias V1~V2. According to the embodiment of the invention, the conductive vias V1~V2 are formed in the insulating build-up layer 210.

Figure 10:
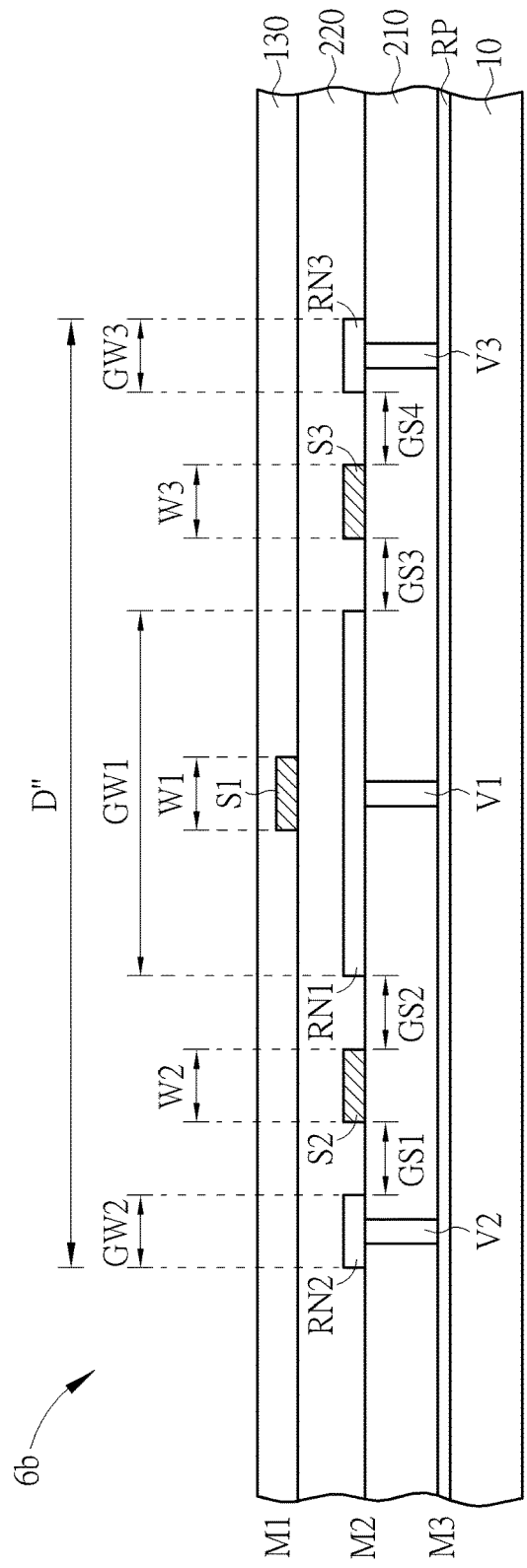
FIG. 10 is a schematic, cross-sectional view showing a substrate having multiple metal layers according to another embodiment of the invention.

FIG. 10 is a schematic, cross-sectional view showing a substrate according to another embodiment of the invention, wherein like numeral numbers designate like layers, regions, or elements. According to the embodiment of the invention, as shown in FIG. 10, a substrate 6b having multiple metal layers is illustrated. For example, the substrate 6b may be a multi-layer PCB such as an 8-layer PCB with 1+6+1 stack-up, a multi-layer HDI PCB, an Any-layer HDI, or a package substrate, but is not limited thereto. It is to be understood that the channel structure illustrated in FIG. 10 may be suited for applications where high-speed or high-frequency signaling and data transmission channel with reduced horizontal span is required.

Likewise, the substrate 6b may comprise a core substrate 10. At least three metal layers M1~M3 in different levels are disposed on one side of the core substrate 10. For the sake of simplicity, the metal traces embedded in the core substrate 10 are not explicitly shown in FIG. 10. Although not shown in this figure, it is to be understood that there may be multiple metal layers disposed on the other side of the core substrate 10. The core substrate 10 may comprise copper traces, which are patterned on an insulating core material layer including, but not limited to, FR-4 epoxy dielectric.

As shown in FIG. 10, the three metal layers comprise a lower metal layer M3, a middle metal layer M2 situated overlying the lower metal layer M3, and an upper metal layer M1 situated overlying the middle metal layer M2. According to the embodiment of the invention, a reference plane RP is arranged in the lower metal layer M3. The reference plane RP may be electrically connected to ground or power. An insulating build-up layer 210 is laminated on the lower metal layer M3 and the reference plane RP. For example, the insulating build-up layer 210 may comprise prepreg material such as 2113 prepreg, but is not limited thereto.

According to the embodiment of the invention, a trio of signal traces that is composed of a first signal trace S1, a second signal trace S2, and a third signal trace S3 is arranged in the upper metal layer M1 and the middle metal layer M2. According to the embodiment of the invention, the trio of signal traces comprises at least a pair of differential signal traces. According to the embodiment of the invention, the trio of signal traces may be operated greater than 1 Gb/s. According to the embodiment of the invention, the second signal trace S2 and the third signal trace S3 are coplanar.

According to the embodiment of the invention, a reference net RN1, a reference net RN2 and a reference net RN3 are arranged in the middle metal layer M2. The reference nets RN1~RN3 may be electrically connected to ground or power. According to the embodiment of the invention, the second signal trace S2, the third signal trace S3 and the reference nets RN1~RN3 are coplanar. The second signal trace S2, and the third signal trace S3 are separated by the reference net RN1. The reference net RN1 is interposed between the second signal trace S2 and the third signal trace S3.

Likewise, an insulating build-up layer 220 is laminated on the middle metal layer M2. For example, the insulating build-up layer 220 may comprise prepreg material such as 2113 prepreg, but is not limited thereto. The insulating build-up layer 220 covers the second signal trace S2, the third signal trace S3 and the reference nets RN1~RN3. The upper metal layer M1 is disposed on the insulating build-up layer 220. A solder mask 130 covers the upper metal layer M1 and the exposed upper surface of the insulating build-up layer 220.

In FIG. 10, a horizontal span D" is defined as the lateral distance or horizontal distance between an outer edge of the reference net RN2 and an outer edge of the reference net RN3, which is equal to the combination of the line widths W2 and W3 of the signal traces S2, S3, the line widths GW1~GW3 of the reference nets RN1~RN3, and the spacing GS1~GS4 between the reference nets RN1~RN3 and the signal traces S2, S3.

According to the embodiment, for example, the line widths W1~W3 of the signal traces S1~S3 may be 100 micrometers. According to the embodiment, the line width W1 of the first signal trace S1 is smaller than or equal to that of the reference net RN1. For example, the line width GW1 of the reference net RN1 may be 400 micrometers. The line widths GW2~GW3 of the reference nets RN2~RN3 may be 100 micrometers. According to the embodiment, for example, the spacings GS1~GS4 may be 100 micrometers. According to the embodiment, for example, the horizontal span D" may be about 1200 micrometers. According to the embodiment, the horizontal span D" is smaller than or equal to 3000 micrometers, and the routing density of signal traces can be increased.

According to the simulation results of the embodiment for dual coupled impedance (impedance simulation using ANSYS Q2D), a single-ended impedance $Z_0$ of about 49.1Ω-49.9Ω can be achieved. A simulated $Z_{diff}$ (S1, S2) of about 96.2Ω, a simulated $Z_{diff}$ (S3, S1) of about 95.0Ω, and a simulated $Z_{diff}$ (S2, S3) of about 97.8Ω can be achieved. A simulated $Z_{com}$ (S1, S2) of about 25.8Ω, a simulated $Z_{com}$ (S3, S1) of about 25.4Ω, and a simulated $Z_{com}$ (S2, S3) of about 24.7Ω can be achieved.

According to the embodiment, the reference net RN1, the reference net RN2 and the reference net RN3 may be electrically connected to the reference plane RP through the conductive vias V1~V3, respectively. According to the embodiment of the invention, the conductive vias V1~V3 are formed in the insulating build-up layer 210.

Figure 11:
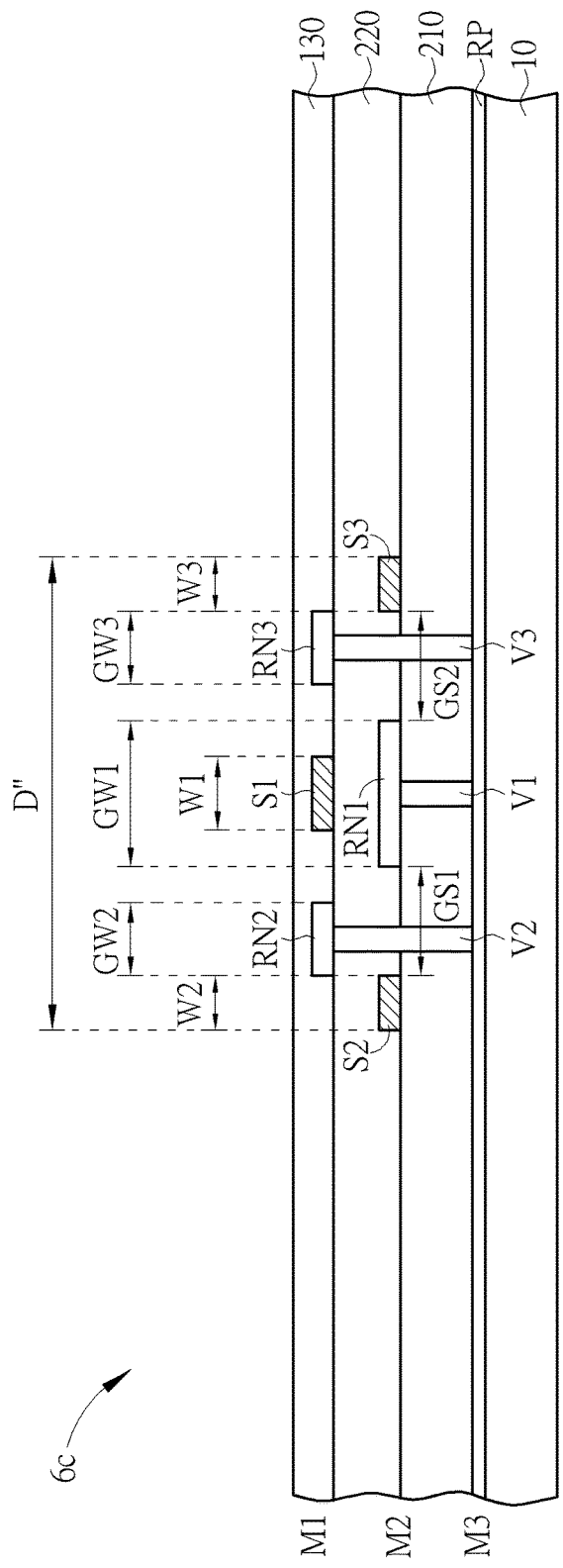
FIG. 11 is a schematic, cross-sectional view showing a substrate having multiple metal layers according to another embodiment of the invention.

FIG. 11 is a schematic, cross-sectional view showing a substrate according to another embodiment of the invention, wherein like numeral numbers designate like layers, regions, or elements. According to the embodiment of the invention, as shown in FIG. 11, a substrate 6c having multiple metal layers is illustrated. For example, the substrate 6c may be a multi-layer PCB such as an 8-layer PCB with 1+6+1 stack-up, a multi-layer HDI PCB, an Any-layer HDI, or a package substrate, but is not limited thereto. It is to be understood that the channel structure illustrated in FIG. 11 may be suited for applications where high-speed or high-frequency signaling and data transmission channel with reduced horizontal span is required.

Likewise, the substrate 6c may comprise a core substrate 10. At least three metal layers M1~M3 in different levels are disposed on one side of the core substrate 10. For the sake of simplicity, the metal traces embedded in the core substrate 10 are not explicitly shown in FIG. 11. Although not shown in this figure, it is to be understood that there may be multiple metal layers disposed on the other side of the core substrate 10. The core substrate 10 may comprise copper traces, which are patterned on an insulating core material layer including, but not limited to, FR-4 epoxy dielectric.

As shown in FIG. 11, the three metal layers comprise a lower metal layer M3, a middle metal layer M2 situated overlying the lower metal layer M3, and an upper metal layer M1 situated overlying the middle metal layer M2. According to the embodiment of the invention, a reference plane RP is arranged in the lower metal layer M3. The reference plane RP may be electrically connected to ground or power. An insulating build-up layer 210 is laminated on the lower metal layer M3 and the reference plane RP. For example, the insulating build-up layer 210 may comprise prepreg material such as 2113 prepreg, but is not limited thereto.

According to the embodiment of the invention, a trio of signal traces that is composed of a first signal trace S1, a second signal trace S2, and a third signal trace S3 is arranged in the upper metal layer M1 and the middle metal layer M2. According to the embodiment of the invention, the trio of signal traces comprises at least a pair of differential signal traces. According to the embodiment of the invention, the trio of signal traces may be operated greater than 1 Gb/s. According to the embodiment of the invention, the second signal trace S2 and the third signal trace S3 are coplanar.

According to the embodiment of the invention, a reference net RN1 is arranged in the middle metal layer M2. A reference net RN2 and a reference net RN3 are arranged in the upper metal layer M1. The reference nets RN1~RN3 may be electrically connected to ground or power. According to the embodiment of the invention, the second signal trace S2, the third signal trace S3 and the reference net RN1 are coplanar. The second signal trace S2 and the third signal trace S3 are separated by the reference net RN1. The reference net RN1 is interposed between the second signal trace S2 and the third signal trace S3. The first signal trace S1, the reference net RN2 and the reference net RN3 are coplanar.

Likewise, an insulating build-up layer 220 is laminated on the middle metal layer M2. For example, the insulating build-up layer 220 may comprise prepreg material such as 2113 prepreg, but is not limited thereto. The insulating build-up layer 220 covers the second signal trace S2, the third signal trace S3 and the reference net RN1. The upper metal layer M1 is disposed on the insulating build-up layer 220. A solder mask 130 covers the upper metal layer M1 and the exposed upper surface of the insulating build-up layer 220.

In FIG. 11, a horizontal span D" is defined as the lateral distance or horizontal distance between an outer edge of the second signal trace S2 and an outer edge of the third signal trace S3, which is equal to the combination of the line widths W2 and W3 of the signal traces S2, S3, the line width GW1 of the reference net RN1, and the spacing GS1~GS2 between the reference net RN1 and the signal traces S2, S3.

According to the embodiment, for example, the line width W1 of the first signal trace S1 may be 88 micrometers. The line widths W2~W3 of the signal traces S2~S3 may be 76 micrometers. According to the embodiment, the line width W1 of the first signal trace S1 is smaller than or equal to that of the reference net RN1. For example, the line width GW1 of the reference net RN1 may be 200 micrometers. The line widths GW2~GW3 of the reference net RN2~RN3 may be 100 micrometers. According to the embodiment, for example, the spacing GS1~GS2 may be 150 micrometers. According to the embodiment, for example, the horizontal span D" may be about 652 micrometers. According to the embodiment, the horizontal span D" is smaller than or equal to 3000 micrometers, and the routing density of signal traces can be increased.

According to the simulation results of the embodiment for dual coupled impedance (impedance simulation using ANSYS Q2D), a single-ended impedance $Z_0$ of about 48.8Ω-49.1Ω can be achieved. A simulated $Z_{diff}$ (S1, S2) of about 96.6Ω, a simulated $Z_{diff}$ (S3, S1) of about 97.4Ω, and a simulated $Z_{diff}$ (S2, S3) of about 98.2Ω can be achieved. A simulated $Z_{com}$ (S1, S2) of about 24.7Ω, a simulated $Z_{com}$ (S3, S1) of about 24.8Ω, and a simulated $Z_{com}$ (S2, S3) of about 24.6Ω can be achieved.

According to the embodiment, the reference net RN1, the reference net RN2 and the reference net RN3 may be electrically connected to the reference plane RP through the conductive vias V1~V3, respectively. According to the embodiment of the invention, the conductive via V1 is formed in the insulating build-up layer 210, and the conductive vias V2~V3 are formed in the insulating build-up layers 210 and 220.

Figure 12:
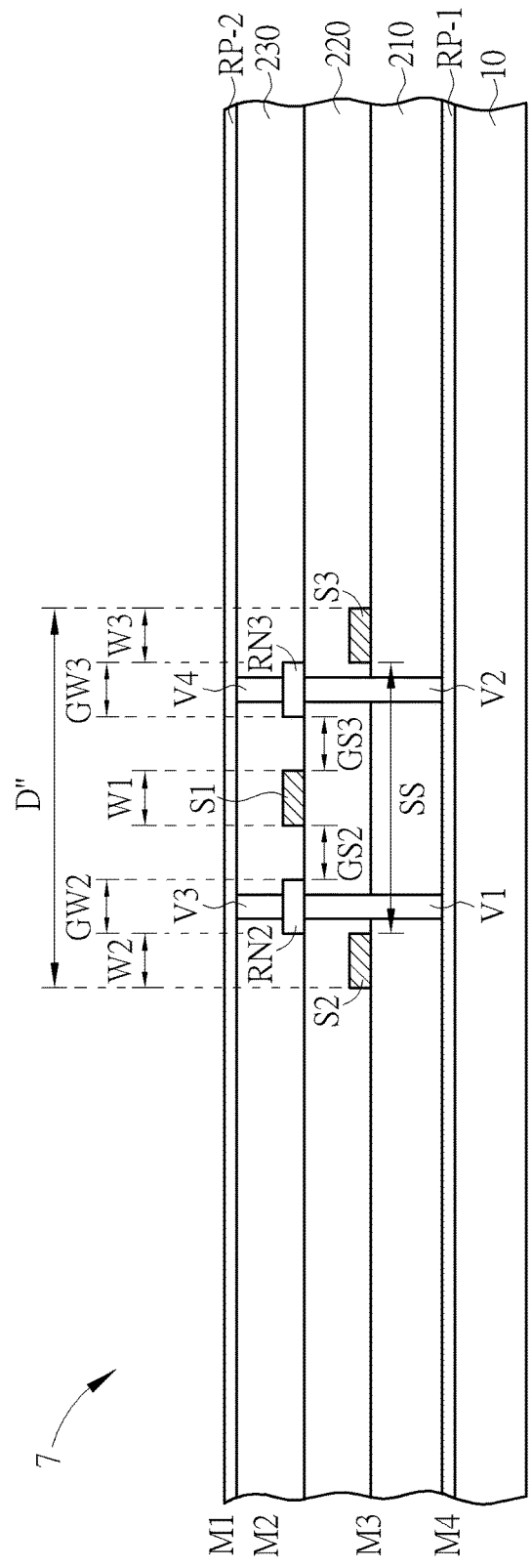
FIG. 12 is a schematic, cross-sectional view showing a substrate having multiple metal layers according to another embodiment of the invention.

FIG. 12 is a schematic, cross-sectional view showing a substrate according to another embodiment of the invention, wherein like numeral numbers designate like layers, regions, or elements. According to the embodiment of the invention, as shown in FIG. 12, a substrate 7 having multiple metal layers is illustrated. For example, the substrate 7 may be a multi-layer PCB such as an 8-layer PCB with 1+6+1 stack-up, a multi-layer HDI PCB, an Any-layer HDI, or a package substrate, but is not limited thereto. It is to be understood that the channel structure illustrated in FIG. 12 may be suited for applications where high-speed or high-frequency signaling and data transmission channel with reduced horizontal span is required.

According to the embodiment, the substrate 7 may comprise a core substrate 10. At least four metal layers M1~M4 in different levels are disposed on one side of the core substrate 10. Although not shown in this figure, it is to be understood that there may be multiple metal layers disposed on the other side of the core substrate 10. The core substrate 10 may comprise copper traces, which are patterned on an insulating core material layer including, but not limited to, FR-4 epoxy dielectric.

As shown in FIG. 12, the three metal layers comprise a lower metal layer M4, a first middle metal layer M3 situated overlying the lower metal layer M4, a second middle metal layer M2 situated overlying the first middle metal layer M3, and an upper metal layer M1 situated overlying the second middle metal layer M2. According to the embodiment of the invention, a first reference plane RP-1 is arranged in the lower metal layer M4 and a second reference plane RP-2 is arranged in the upper metal layer M1. The first reference plane RP-1 may be electrically connected to ground or power. An insulating build-up layer 210 is laminated on the lower metal layer M4 and the first reference plane RP-1. For example, the insulating build-up layer 210 may comprise prepreg material such as 2113 prepreg, but is not limited thereto.

According to the embodiment of the invention, a trio of signal traces that is composed of a first signal trace S1, a second signal trace S2 and a third signal trace S3 is arranged in the first middle layer M3 and the second middle metal layer M2. The first signal trace S1 is arranged in the second middle metal layer M2, and the second signal trace S2 and the third signal trace S3 are arranged in the first middle layer M3. The first signal trace S1 overlaps with the second reference plane RP-2. According to the embodiment of the invention, the trio of signal traces comprises at least a pair of differential signal traces. According to the embodiment of the invention, the trio of signal traces may be operated greater than 1 Gb/s. According to the embodiment of the invention, the second signal trace S2 and the third signal trace S3 are coplanar.

According to the embodiment of the invention, the reference net RN1 between the second signal trace S2 and the third signal trace S3 as shown in FIG. 11 is omitted here in FIG. 12. The reference net RN2 and the reference net RN3 are arranged in the upper metal layer M1. The reference nets RN2~RN3 may be electrically connected to ground or power. The reference nets RN2~RN3 may be electrically connected to the first reference plane RP-1 and/or the second reference plane RP-2 through the vias V1~V4. According to the embodiment of the invention, the first signal trace S1 and the reference nets RN2~RN3 are coplanar. The first signal trace S1 is interposed between the reference net RN2 and the reference net RN3. The pair of reference nets RN2~RN3 sandwich about the first signal trace S1. The reference nets RN2 is located between the second signal trace S2 and the first signal trace S1, and the reference nets RN3 is located between the third signal trace S3 and the first signal trace S1.

An insulating build-up layer 220 is laminated on the first middle metal layer M3 and on the insulating build-up layer 210. For example, the insulating build-up layer 220 may comprise prepreg material such as 2113 prepreg, but is not limited thereto. The insulating build-up layer 220 covers the second signal trace S2 and the third signal trace S3. The second middle metal layer M2 is disposed on the insulating build-up layer 220. An insulating build-up layer 230 is laminated on the second middle metal layer M2 and on the insulating build-up layer 220. The second reference plane RP-2 is disposed on the insulating build-up layer 230.

In FIG. 12, a horizontal span D" is defined as the lateral distance or horizontal distance between an outer edge of the second signal trace S2 and an outer edge of the third signal trace S3, which is equal to the combination of the line widths W2 and W3 of the signal traces S2, S3 and the spacing SS between the signal traces S2, S3.

According to the embodiment, for example, the line width W1 of the first signal trace S1 may be 76 micrometers. The line widths W2~W3 of the signal traces S2~S3 may be 76 micrometers. The line widths GW2~GW3 of the reference net RN2~RN3 may be 76 micrometers. According to the embodiment, for example, the spacing GS2-GS3 may be 76 micrometers. The spacing SS between the signal traces S2, S3 may be 400 micrometers. According to the embodiment, for example, the horizontal span D" may be about 552 micrometers (76 μm+400 μm+76 μm). According to the embodiment, the horizontal span D" is smaller than or equal to 3000 micrometers, and the routing density of signal traces can be increased.

According to the simulation results of the embodiment for dual coupled impedance (impedance simulation using ANSYS Q2D), a single-ended impedance $Z_0$ of about 49.6Ω-49.9Ω can be achieved. A simulated $Z_{diff}$ (S1, S2) of about 97.6Ω, a simulated $Z_{diff}$ (S3, S1) of about 97.0Ω, and a simulated $Z_{diff}$ (S2, S3) of about 99.1Ω can be achieved. A simulated $Z_{com}$ (S1, S2) of about 25.5Ω, a simulated $Z_{com}$ (S3, S1) of about 25.3Ω, and a simulated $Z_{com}$ (S2, S3) of about 24.8Ω can be achieved.

Figure 13:
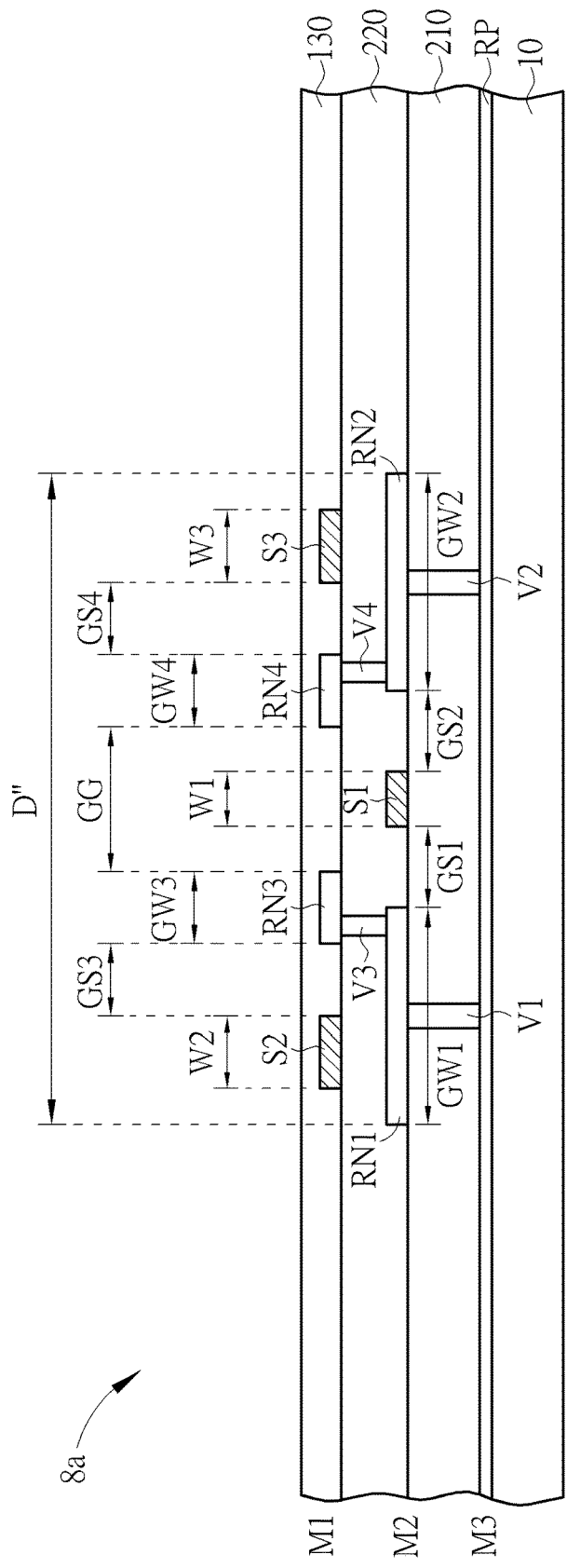
FIG. 13 is a schematic, cross-sectional view showing a substrate having multiple metal layers according to another embodiment of the invention.

FIG. 13 is a schematic, cross-sectional view showing a substrate according to another embodiment of the invention, wherein like numeral numbers designate like layers, regions, or elements. According to the embodiment of the invention, as shown in FIG. 13, a substrate 8a having multiple metal layers is illustrated. For example, the substrate 8a may be a multi-layer PCB such as an 8-layer PCB with 1+6+1 stack-up, a multi-layer HDI PCB, an Any-layer HDI, or a package substrate, but is not limited thereto. It is to be understood that the channel structure illustrated in FIG. 13 may be suited for applications where high-speed or high-frequency signaling and data transmission channel with reduced horizontal span is required.

For example, the substrate 8a may comprise a core substrate 10. At least three metal layers M1~M3 in different levels are disposed on one side of the core substrate 10. For the sake of simplicity, the metal traces embedded in the core substrate 10 are not explicitly shown in FIG. 13. Although not shown in this figure, it is to be understood that there may be multiple metal layers disposed on the other side of the core substrate 10. The core substrate 10 may comprise copper traces, which are patterned on an insulating core material layer including, but not limited to, FR-4 epoxy dielectric.

As shown in FIG. 13, the three metal layers comprise a lower metal layer M3, a middle metal layer M2 situated overlying the lower metal layer M3, and an upper metal layer M1 situated overlying the middle metal layer M2. According to the embodiment of the invention, a reference plane RP is arranged in the lower metal layer M3. The reference plane RP may be electrically connected to ground or power. An insulating build-up layer 210 is laminated on the lower metal layer M3 and the reference plane RP. For example, the insulating build-up layer 210 may comprise prepreg material such as 2113 prepreg, but is not limited thereto.

According to the embodiment of the invention, a trio of signal traces composed of a first signal trace S1, a second signal trace S2, and a third signal trace S3 is provided. The first signal trace S1 is arranged in the middle metal layer M2 and on the insulating build-up layer 210. The second signal trace S2 and the third signal trace S3 are arranged in the upper metal layer M1. According to the embodiment of the invention, the trio of signal traces comprises at least a pair of differential signal traces. According to the embodiment of the invention, the trio of signal traces may be operated greater than 1 Gb/s. According to the embodiment of the invention, the second signal trace S2 and the third signal trace S3 are coplanar.

According to the embodiment of the invention, a reference net RN1 and a reference net RN2 are arranged in the middle metal layer M2. A reference net RN3 and a reference net RN4 are arranged in the upper metal layer M1. The first signal trace S1 does not overlap with the reference net RN3 or the reference net RN4 when viewed from the above. The second signal trace S2 overlaps with the reference net RN1 and the third signal trace S3 overlaps with the reference net RN2 when viewed from the above. The reference nets RN1~RN4 may be electrically connected to ground or power. According to the embodiment of the invention, the second signal trace S2, the third signal trace S3 and the reference nets RN3~RN4 are coplanar. The second signal trace S2 and the third signal trace S3 are separated by the reference nets RN3~RN4. The reference nets RN3~RN4 are interposed between the second signal trace S2 and the third signal trace S3. The first signal trace S1, the reference net RN1 and the reference net RN2 are coplanar, and the reference nets RN3~RN4 don't overlap with the first signal trace S1 in the thickness direction.

An insulating build-up layer 220 is laminated on the middle metal layer M2. For example, the insulating build-up layer 220 may comprise prepreg material such as 2113 prepreg, but is not limited thereto. The upper metal layer M1 is disposed on the insulating build-up layer 220. A solder mask 130 covers the upper metal layer M1 and the exposed upper surface of the insulating build-up layer 220.

In FIG. 13, a horizontal span D" is defined as the lateral distance or horizontal distance between an outer edge of the reference net RN1 and an outer edge of the reference net RN2, which is equal to the combination of the line width W1 of the first signal trace S1, the line widths GW1, GW2 of the reference nets RN1~RN2, and the spacing GS1, GS2 between the reference nets RN1~RN2 and the first signal trace S1.

According to the embodiment, the line width W1 of the first signal trace S1 is smaller than the line widths GW1, GW2 of the reference nets RN1, RN2. According to the embodiment, the line width W1 of the first signal trace S1 is smaller than or equal to the line widths W2, W3 of second signal trace S2, S3.

For example, the line width W1 of the first signal trace S1 may be 76 micrometers, and the line widths W2, W3 of the signal traces S2, S3 may be 100 micrometers. According to the embodiment, for example, the line widths GW1, GW2 of the reference nets RN1, RN2 may be 300 micrometers, and the line widths GW3, GW4 of the reference nets RN3, RN4 may be 100 micrometers. According to the embodiment, for example, the spacing GS1, GS2 between the reference nets RN1~RN2 and the first signal trace S1 may be 106 micrometers, and the spacing GS3, GS4 between the reference nets RN3, RN4 and the signal traces S2, S3 may be 100 micrometers. According to the embodiment, for example, the spacing GG between the reference nets RN3, RN4 may be 200 micrometers. The spacing GG like a gap in the reference net or plane that is separated into the reference nets RN3, RN4. According to the embodiment, for example, the horizontal span D" may be about 888 micrometers. According to the embodiment, the horizontal span D" is smaller than or equal to 3000 micrometers, and the routing density of signal traces can be increased.

According to the simulation results of the embodiment for dual coupled impedance (impedance simulation using ANSYS Q2D), a single-ended impedance $Z_0$ of about 48.5Ω-48.7Ω can be achieved. A simulated $Z_{diff}$(S3, S2) of about 96.4Ω, a simulated $Z_{diff}$(S2, S1) of about 97.1Ω, and a simulated $Z_{diff}$(S1, S3) of about 96.6Ω can be achieved. A simulated $Z_{com}$(S3, S2) of about 24.4Ω, a simulated $Z_{com}$(S2, S1) of about 24.5Ω, and a simulated $Z_{com}$(S1, S3) of about 24.4Ω can be achieved.

According to the embodiment of the invention, the reference nets RN1, RN2 form a first pair of reference nets that sandwich about the first signal trace S1. The reference nets RN1, RN2 may be electrically connected to the reference plane RP through the conductive vias V1, V2, respectively. The reference nets RN3, RN4 form a second pair of reference nets interposed between the second signal trace S2 and the third signal trace S3. The reference nets RN3, RN4 may be electrically connected to the reference nets RN1, RN2 through the conductive vias V3, V4, respectively. According to the embodiment of the invention, the conductive vias V1, V2 are formed in the insulating build-up layer 210 and the conductive vias V3, V4 are formed in the insulating build-up layer 220.

Figure 14:
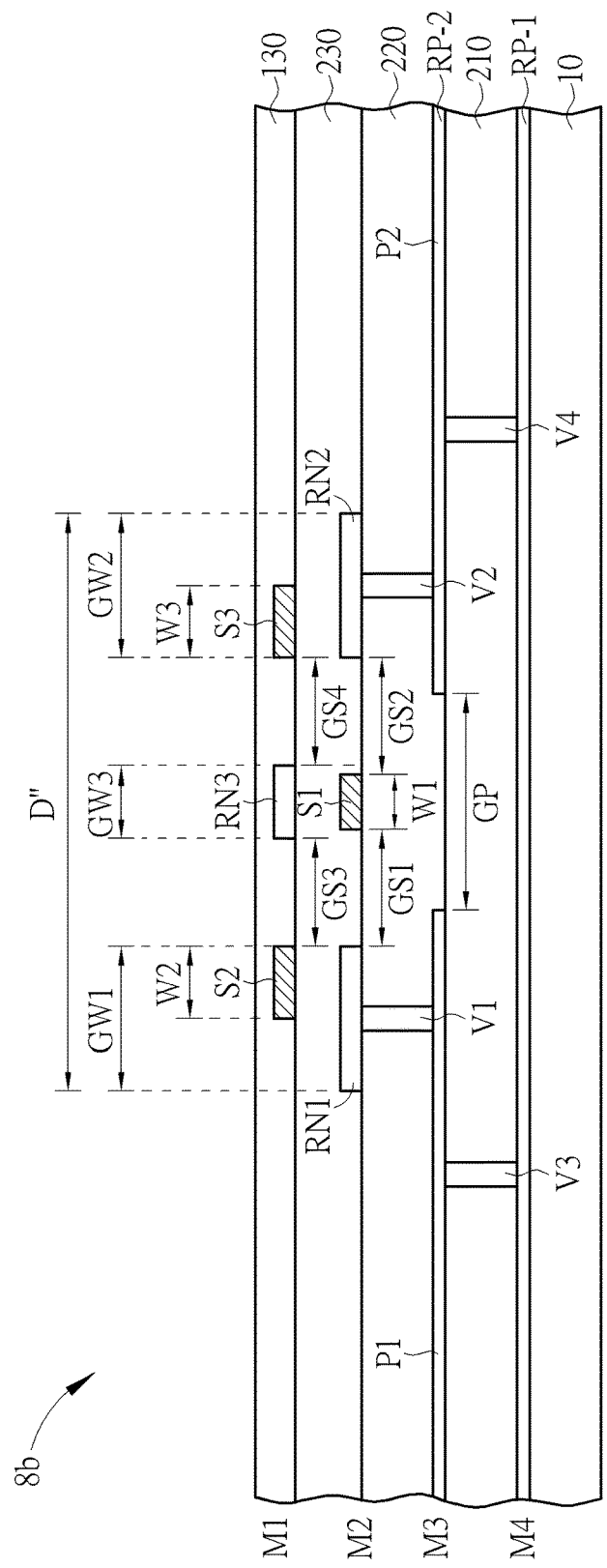
FIG. 14 is a schematic, cross-sectional view showing a substrate having multiple metal layers according to another embodiment of the invention.

FIG. 14 is a schematic, cross-sectional view showing a substrate according to another embodiment of the invention, wherein like numeral numbers designate like layers, regions, or elements. According to the embodiment of the invention, as shown in FIG. 14, a substrate 8b having multiple metal layers is illustrated. For example, the substrate 8b may be a multi-layer PCB such as an 8-layer PCB with 1+6+1 stack-up, a multi-layer HDI PCB, an Any-layer HDI, or a package substrate, but is not limited thereto. It is to be understood that the channel structure illustrated in FIG. 14 may be suited for applications where high-speed or high-frequency signaling and data transmission channel with reduced horizontal span is required.

For example, the substrate 8b may comprise a core substrate 10. At least four metal layers M1~M4 in different levels are disposed on one side of the core substrate 10. For the sake of simplicity, the metal traces embedded in the core substrate 10 are not explicitly shown in FIG. 14. Although not shown in this figure, it is to be understood that there may be multiple metal layers disposed on the other side of the core substrate 10. The core substrate 10 may comprise copper traces, which are patterned on an insulating core material layer including, but not limited to, FR-4 epoxy dielectric.

As shown in FIG. 14, the four metal layers comprise a lower metal layer M4, a first middle metal layer M3 situated overlying the lower metal layer M4, a second middle metal layer M2 situated overlying the first middle metal layer M3, and an upper metal layer M1 situated overlying the second middle metal layer M2. According to the embodiment of the invention, a first reference plane RP-1 is arranged in the lower metal layer M4 and a second reference plane RP-2 is arranged in the first middle metal layer M3. The first reference plane RP-1 and the second reference plane RP-2 may be electrically connected to ground or power. An insulating build-up layer 210 is laminated on the lower metal layer M4 and the first reference plane RP-1. An insulating build-up layer 220 is laminated on the first middle metal layer M3 and the second reference plane RP-2. For example, the insulating build-up layers 210, 220 may comprise prepreg material such as 2113 prepreg, but is not limited thereto.

According to the embodiment of the invention, a trio of signal traces composed of a first signal trace S1, a second signal trace S2, and a third signal trace S3 is provided. The first signal trace S1 is arranged in the second middle metal layer M2 and on the insulating build-up layer 220. The second signal trace S2 and the third signal trace S3 are arranged in the upper metal layer M1. According to the embodiment of the invention, the trio of signal traces comprises at least a pair of differential signal traces. According to the embodiment of the invention, the trio of signal traces may be operated greater than 1 Gb/s. According to the embodiment of the invention, the second signal trace S2 and the third signal trace S3 are coplanar.

According to the embodiment of the invention, a gap GP is provided in the second reference plane RP-2. The gap GP is located directly under the first signal trace S1. The gap GP may have a gap width that is wider than the line width of the first signal trace S1. For example, the gap GP may have a gap width of about 300 micrometers. According to the embodiment of the invention, the gap GP may separate the second reference plane RP-2 into a first part P1 and a second part P2.

According to the embodiment of the invention, a reference net RN1 and a reference net RN2 are arranged in the second middle metal layer M2. A reference net RN3 is arranged in the upper metal layer M1. The first signal trace S1 is located directly under the reference net RN3. The reference nets RN1~RN3 may be electrically connected to ground or power. According to the embodiment of the invention, the second signal trace S2, the third signal trace S3 and the reference net RN3 are coplanar. The second signal trace S2 and the third signal trace S3 are separated by the reference net RN3. The reference net RN3 is interposed between the second signal trace S2 and the third signal trace S3. The first signal trace S1, the reference net RN1 and the reference net RN2 are coplanar.

An insulating build-up layer 230 is laminated on the second middle metal layer M2. For example, the insulating build-up layer 230 may comprise prepreg material such as 2113 prepreg, but is not limited thereto. The upper metal layer M1 is disposed on the insulating build-up layer 230. A solder mask 130 covers the upper metal layer M1 and the exposed upper surface of the insulating build-up layer 230.

In FIG. 14, a horizontal span D" is defined as the lateral distance or horizontal distance between an outer edge of the reference net RN1 and an outer edge of the reference net RN2, which is equal to the combination of the line width W1 of the first signal trace S1, the line widths GW1, GW2 of the reference nets RN1, RN2, and the spacing GS1, GS2 between the reference nets RN1, RN2 and the first signal trace S1.

According to the embodiment, the line width W1 of the first signal trace S1 is smaller than the line widths GW1, GW2 of the reference nets RN1, RN2. According to the embodiment, the line width W1 of the first signal trace S1 is smaller than or equal to the line widths W2, W3 of second signal traces S2, S3, and the gap width GP.

For example, the line width W1 of the first signal trace S1 may be 76 micrometers, and the line widths W2, W3 of the signal traces S2, S3 may be 100 micrometers. According to the embodiment, for example, the line widths GW1, GW2 of the reference nets RN1, RN2 may be 200 micrometers, and the line width GW3 of the reference net RN3 may be 100 micrometers. According to the embodiment, for example, the spacing GS1, GS2 between the reference nets RN1, RN2 and the first signal trace S1 may be 162 micrometers, and the spacing GS3, GS4 between the reference net RN3 and the signal traces S2, S3 may be 150 micrometers. According to the embodiment, for example, the horizontal span D" may be about 800 micrometers. According to the embodiment, the horizontal span D" is smaller than or equal to 3000 micrometers, and the routing density of signal traces can be increased.

According to the simulation results of the embodiment for dual coupled impedance (impedance simulation using ANSYS Q2D), a single-ended impedance $Z_0$ of about 47.4Ω-50.3Ω can be achieved. A simulated $Z_{diff}$ (S3, S2) of about 99.0Ω, a simulated $Z_{diff}$ (S2, S1) of about 91.4Ω, and a simulated $Z_{diff}$ (S1, S3) of about 96.7Ω can be achieved. A simulated $Z_{com}$ (S3, S2) of about 25.6Ω, a simulated $Z_{com}$ (S2, S1) of about 24.6Ω, and a simulated $Z_{com}$ (S1, S3) of about 26.2Ω can be achieved.

According to the embodiment of the invention, the reference nets RN1, RN2 form a pair of reference nets that sandwich about the first signal trace S1. The reference nets RN1, RN2 may be electrically connected to the first part P1 and the second part P2 of second reference plane RP-2 through the conductive vias V1, V2, respectively. The reference net RN3 is interposed between the second signal trace S2 and the third signal trace S3. According to the embodiment of the invention, the conductive vias V1, V2 are formed in the insulating build-up layer 220. The first part P1 and the second part P2 of the second reference plane RP-2 may be electrically connected to the first reference plane RP-1 through the conductive vias V3, V4, respectively.

Figure 15:
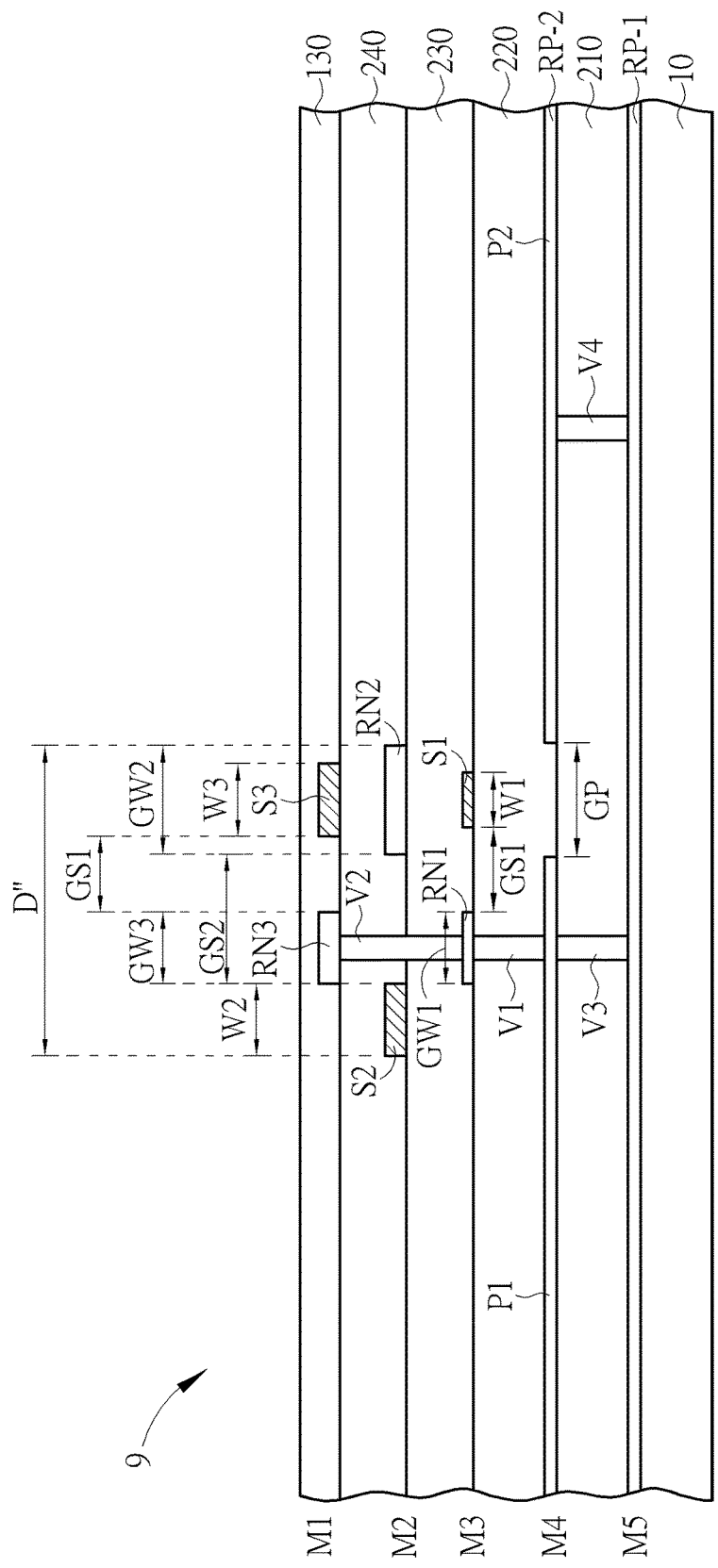
FIG. 15 is a schematic, cross-sectional view showing a substrate having multiple metal layers according to another embodiment of the invention.

FIG. 15 is a schematic, cross-sectional view showing a substrate according to another embodiment of the invention, wherein like numeral numbers designate like layers, regions, or elements. According to the embodiment of the invention, as shown in FIG. 15, a substrate 9 having multiple metal layers is illustrated. For example, the substrate 9 may be a multi-layer PCB such as an 8-layer PCB with 1+6+1 stack-up, a multi-layer HDI PCB, an Any-layer HDI, or a package substrate, but is not limited thereto. It is to be understood that the channel structure illustrated in FIG. 15 may be suited for applications where high-speed or high-frequency signaling and data transmission channel with reduced horizontal span is required.

For example, the substrate 9 may comprise a core substrate 10. At least five metal layers M1~M5 in different levels are disposed on one side of the core substrate 10. Although not shown in this figure, it is to be understood that there may be multiple metal layers disposed on the other side of the core substrate 10. The core substrate 10 may comprise copper traces, which are patterned on an insulating core material layer including, but not limited to, FR-4 epoxy dielectric.

As shown in FIG. 15, the five metal layers comprise a lower metal layer M5, middle metal layers M2~M4 situated overlying the lower metal layer M5, and an upper metal layer M1. According to the embodiment of the invention, a first reference plane RP-1 is arranged in the lower metal layer M5 and a second reference plane RP-2 is arranged in the middle metal layer M4. The first reference plane RP-1 and the second reference plane RP-2 may be electrically connected to ground or power. An insulating build-up layer 210 is laminated on the lower metal layer M5 and the first reference plane RP-1. An insulating build-up layer 220 is laminated on the middle metal layer M4 and the second reference plane RP-2. For example, the insulating build-up layers 210, 220 may comprise prepreg material such as 2113 prepreg, but is not limited thereto.

According to the embodiment of the invention, a trio of signal traces composed of a first signal trace S1, a second signal trace S2, and a third signal trace S3 is provided. The first signal trace S1 is arranged in the middle metal layer M3. The second signal trace S2 is arranged in the middle metal layer M2. The third signal trace S3 is arranged in the upper metal layer M1. According to the embodiment of the invention, the trio of signal traces comprises at least a pair of differential signal traces. According to the embodiment of the invention, the trio of signal traces may be operated greater than 1 Gb/s.

According to the embodiment of the invention, a gap GP is provided in the second reference plane RP-2. The gap GP is located directly under the first signal trace S1. The gap GP may have a gap width that is wider than the line width of the first signal trace S1. For example, the gap GP may have a gap width of about 150 micrometers. According to the embodiment of the invention, the gap GP may separate the second reference plane RP-2 into a first part P1 and a second part P2.

According to the embodiment of the invention, a reference net RN1 is arranged in the middle metal layer M3. A reference net RN2 is arranged in the middle metal layer M2. A reference net RN3 is arranged in the upper metal layer M1. The first signal trace S1 is located directly under the reference net RN2. The reference net RN2 overlaps with the first signal trace S1 and the third signal trace S3 when viewed from the above. The reference nets RN1~RN3 may be electrically connected to ground or power. According to the embodiment of the invention, the first signal trace S1 and the reference net RN1 are coplanar, the second signal trace S2 and the reference net RN2 are coplanar, and the third signal trace S3 and the reference net RN3 are coplanar.

An insulating build-up layer 230 is laminated on the second middle metal layer M2. For example, the insulating build-up layer 230 may comprise prepreg material such as 2113 prepreg, but is not limited thereto. The upper metal layer M1 is disposed on the insulating build-up layer 230. A solder mask 130 covers the upper metal layer M1 and the exposed upper surface of the insulating build-up layer 230.

In FIG. 15, a horizontal span D" is defined as the lateral distance or horizontal distance between an outer edge of the second signal trace S2 and an outer edge of the reference net RN2, which is equal to the combination of the line width W2 of the second signal trace S2, the line width GW2 of the reference net RN2, and the spacing GS2 between the reference net RN2 and the second signal trace S2.

According to the embodiment, the line width W1 of the first signal trace S1 is smaller than the line widths GW1, GW2 of the reference nets RN1, RN2. According to the embodiment, the line width W1 of the first signal trace S1 is smaller than or equal to the line widths W2, W3 of second signal trace S2, S3. According to the embodiment, the line width GW2 of the reference net RN2 is greater than or equal to the line widths W2, W3 of signal traces S2, S3.

According to the embodiment, for example, the line width W1 of the first signal trace S1 may be 76 micrometers, and the line widths W2, W3 of the signal traces S2, S3 may be 100 micrometers. According to the embodiment, for example, the line width GW1 of the reference net RN1 may be 100 micrometers, the line width GW2 of the reference net RN2 may be 150 micrometers, and the line width GW3 of the reference net RN3 may be 100 micrometers. According to the embodiment, for example, the spacing GS1 between the reference net RN1 and the first signal trace S1 may be 112 micrometers, the spacing GS2 between the reference net RN2 and the second signal trace S2 may be 175 micrometers, and the spacing GS3 between the reference net RN3 and the third signal trace S3 may be 100 micrometers. According to the embodiment, for example, the horizontal span D" may be about 425 micrometers. According to the embodiment, the horizontal span D" is smaller than or equal to 3000 micrometers, and the routing density of signal traces can be increased.

According to the simulation results of the embodiment for dual coupled impedance (impedance simulation using ANSYS Q2D), a single-ended impedance $Z_0$ of about 47.9Ω-48.4Ω can be achieved. A simulated $Z_{diff}$ (S3, S2) of about 94.0Ω, a simulated $Z_{diff}$ (S3, S1) of about 95.8Ω, and a simulated $Z_{diff}$ (S2, S1) of about 95.4Ω can be achieved. A simulated $Z_{com}$ (S3, S2) of about 24.4Ω, a simulated $Z_{com}$ (S3, S1) of about 24.4Ω, and a simulated $Z_{com}$ (S2, S1) of about 24.3Ω can be achieved.

According to the embodiment of the invention, the reference net RN1 may be electrically connected to the first part P1 of second reference plane RP-2 through the conductive via V1. The reference net RN3 may be electrically connected to the reference net RN1 through the conductive via V2. According to the embodiment of the invention, the conductive via V1 is formed in the insulating build-up layer 220, and the conductive via V2 is formed in the insulating build-up layers 230 and 240. The first part P1 and the second part P2 of the second reference plane RP-2 may be electrically connected to the first reference plane RP-1 through the conductive vias V3, V4, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A substrate having multiple metal layers, comprising:
 a plurality of metal layers disposed in different levels, wherein the plurality of metal layers comprises a lower metal layer, a middle metal layer situated overlying the lower layer, and an upper metal layer situated overlying the middle metal layer;
 a solder mask covering the upper metal layer;
 a reference plane arranged in the lower metal layer;
 a trio of signal traces arranged in the middle metal layer, wherein the trio of signal traces comprises a first signal trace, a second signal trace, a third signal trace, and wherein the trio of signal traces comprises at least a pair of differential signal traces;
 a plurality of reference nets arranged in the middle metal layer, wherein the plurality of reference nets comprises a first reference net, a second reference net, a third reference net, and a fourth reference net; and
 the first signal trace is interposed between the first reference net and the second reference net, the second signal trace is interposed between the second reference net and the third reference net, and the third signal trace is interposed between the third reference net and the fourth reference net.

2. The substrate having multiple metal layers according to claim 1, wherein the trio of signal traces is operated greater than 1 Gb/s.

3. The substrate having multiple metal layers according to claim 1, wherein no metal trace is disposed in the upper metal layer in a region directly above a horizontal span between the first signal trace and the third signal trace.

4. The substrate having multiple metal layers according to claim 1, wherein a horizontal span between the first reference net and the fourth reference net is equal to or smaller than 3000 micrometers.

5. The substrate having multiple metal layers according to claim 1, wherein the reference plane is electrically connected to ground or power, and the plurality of reference nets are electrically connected to the reference plane through a plurality of conductive vias.

6. The substrate having multiple metal layers according to claim 1, wherein the trio of signal traces electrically connects between a connector region and a chip package mounting region on the substrate.

7. The substrate having multiple metal layers according to claim 1, wherein common-mode impedances of the trio of signal traces range between 20Ω and 30Ω.

8. A substrate having multiple metal layers, comprising:
    a plurality of metal layers disposed in different levels, wherein the plurality of metal layers comprises a lower metal layer, a middle metal layer situated overlying the lower layer, and an upper metal layer situated overlying the middle metal layer;
    a solder mask covering the upper metal layer;
    a reference plane arranged in the lower metal layer;
    a trio of signal traces comprising a first signal trace arranged in the upper metal layer and a second signal trace and a third signal trace arranged in the middle metal layer, wherein the trio of signal traces comprises at least a pair of differential signal traces; and
    a first reference net arranged in the middle metal layer between the second signal trace and the third signal trace and directly under the first signal trace.

9. The substrate having multiple metal layers according to claim 8, wherein the trio of signal traces is operated greater than 1 Gb/s.

10. The substrate having multiple metal layers according to claim 8 further comprising a second reference net and a third reference net in the middle metal layer, and wherein the second signal trace is interposed between the first reference net and the second reference net, and the third signal trace is interposed between the first reference net and the third reference net.

11. The substrate having multiple metal layers according to claim 8 further comprising a second reference net and a third reference net in the upper metal layer, and wherein the first signal trace is interposed between the second reference net and the third reference net.

12. The substrate having multiple metal layers according to claim 8, wherein the first signal trace has a line width that is smaller than or equal to that of the first reference net.

13. The substrate having multiple metal layers according to claim 8, wherein the reference plane is electrically connected to ground or power, and the first reference net is electrically connected to the reference plane through a conductive via.

14. The substrate having multiple metal layers according to claim 8, wherein common-mode impedances of the trio of signal traces range between 20Ω and 30Ω.

15. The substrate having multiple metal layers according to claim 8, wherein a horizontal span between the second signal trace and the third signal trace is equal to or smaller than 3000 micrometers.

16. A substrate having multiple metal layers, comprising:
    a plurality of metal layers disposed in different levels, wherein the plurality of metal layers comprises a lower metal layer, a first middle metal layer situated overlying the lower layer, a second middle metal layer situated overlying the first middle metal layer, and an upper metal layer situated overlying the second middle metal layer;
    a first reference plane arranged in the lower metal layer;
    a second reference plane arranged in the upper metal layer;
    a trio of signal traces comprising a first signal trace arranged in the second middle metal layer, and a second signal trace and a third signal trace arranged in the first middle metal layer, wherein the trio of signal traces comprises at least a pair of differential signal traces; and
    a pair of reference nets in the second middle metal layer sandwiching about the first signal trace.

17. The substrate having multiple metal layers according to claim 16, wherein the trio of signal traces is operated greater than 1 Gb/s.

18. The substrate having multiple metal layers according to claim 16, wherein the first and second reference planes are electrically connected to ground or power, and the pair of reference nets are electrically connected to the first or the second reference plane through a plurality of conductive vias.

19. The substrate having multiple metal layers according to claim 16, wherein common-mode impedances of the trio of signal traces range between 20Ω and 3Ω.

20. The substrate having multiple metal layers according to claim 16, wherein a horizontal span between the second signal trace and the third signal trace is equal to or smaller than 3000 micrometers.

21. A substrate having multiple metal layers, comprising:
    a plurality of metal layers disposed in different levels, wherein the plurality of metal layers comprises a lower metal layer, a middle metal layer situated overlying the lower layer, and an upper metal layer situated overlying the middle metal layer;
    a solder mask covering the upper metal layer;
    a reference plane arranged in the lower metal layer;
    a trio of signal traces comprising a first signal trace arranged in the middle metal layer, and a second signal trace and a third signal trace arranged in the upper metal layer, wherein the trio of signal traces comprises at least a pair of differential signal traces; and
    a first pair of reference nets in the middle metal layer sandwiching about the first signal trace.

22. The substrate having multiple metal layers according to claim 21 further comprising:
    a second pair of reference nets in the upper metal layer, wherein the second pair of reference nets is interposed between the second signal trace and the third signal trace, and does not overlap with the first signal trace.

23. The substrate having multiple metal layers according to claim 21 further comprising:
    a reference net in the upper metal layer between the second signal trace and the third signal trace.

24. The substrate having multiple metal layers according to claim 21 further comprising:

a gap in the reference plane, wherein the gap is located directly under the first signal trace.

25. The substrate having multiple metal layers according to claim 21, wherein the reference plane is electrically connected to ground or power, and the first pair of reference nets are electrically connected to the reference plane through a plurality of conductive vias.

26. The substrate having multiple metal layers according to claim 21, wherein common-mode impedances of the trio of signal traces range between 20Ω and 30Ω.

27. The substrate having multiple metal layers according to claim 21, wherein a horizontal span between the first pair of reference nets is equal to or smaller than 3000 micrometers.

28. A substrate having multiple metal layers, comprising:
a plurality of metal layers disposed in different levels, wherein the plurality of metal layers comprises a lower metal layer, a first middle metal layer situated overlying the lower layer, a second middle metal layer situated overlying the first middle metal layer, a third middle metal layer situated overlying the second middle metal layer, and an upper metal layer situated overlying the third middle metal layer;
a first reference plane arranged in the lower metal layer;
a second reference plane arranged in the first middle metal layer; and
a trio of signal traces comprising a first signal trace arranged in the second middle metal layer, a second signal trace arranged in the third middle metal layer, and a third signal trace arranged in the upper metal layer, wherein the trio of signal traces comprises at least a pair of differential signal traces.

29. The substrate having multiple metal layers according to claim 28 further comprising:
a first reference net in the second middle metal layer and in proximity to the first signal trace;
a second reference net in the third middle metal layer and in proximity to the second signal trace; and
a third reference net in the upper metal layer and in proximity to the third signal trace, wherein the first signal trace is located directly under the second reference net, and wherein the second reference net overlaps with the first signal trace and the third signal trace.

30. The substrate having multiple metal layers according to claim 28 further comprising:
a gap provided in the second reference plane, wherein the gap is located directly under the first signal trace.

31. The substrate having multiple metal layers according to claim 30, wherein the gap has a gap width that is wider than a line width of the first signal trace.

32. The substrate having multiple metal layers according to claim 28, wherein the trio of signal traces is operated greater than 1 Gb/s.

33. The substrate having multiple metal layers according to claim 28, wherein the first and second reference planes are electrically connected through a plurality of conductive vias.

34. The substrate having multiple metal layers according to claim 28, wherein common-mode impedances of the trio of signal traces range between 20Ω and 30Ω.

35. The substrate having multiple metal layers according to claim 29, wherein a horizontal span between the second signal trace and the second reference net is equal to or smaller than 3000 micrometers.

* * * * *